(12) United States Patent
Chang et al.

(10) Patent No.: US 9,837,352 B2
(45) Date of Patent: Dec. 5, 2017

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Yung-Shun Chang, Kaohsiung (TW); Chien-Hua Chen, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/179,683

(22) Filed: Jun. 10, 2016

(65) Prior Publication Data

US 2017/0103946 A1   Apr. 13, 2017

Related U.S. Application Data

(60) Provisional application No. 62/238,341, filed on Oct. 7, 2015.

(51) Int. Cl.

| H01L 29/00 | (2006.01) |
| H01L 23/522 | (2006.01) |
| H01L 21/48 | (2006.01) |
| H01L 21/56 | (2006.01) |
| H01L 23/31 | (2006.01) |

(Continued)

(52) U.S. Cl.
CPC ........ *H01L 23/5227* (2013.01); *H01L 21/486* (2013.01); *H01L 21/4853* (2013.01); *H01L 21/565* (2013.01); *H01L 23/3114* (2013.01); *H01L 23/49827* (2013.01); *H01L 23/49838* (2013.01); *H01L 23/5223* (2013.01); *H01L 24/97* (2013.01); *H01L 21/561* (2013.01); *H01L 21/568* (2013.01); *H01L 23/3128* (2013.01); *H01L 24/13* (2013.01); *H01L 24/16* (2013.01); *H01L 24/81* (2013.01); *H01L 2021/60022* (2013.01); *H01L 2224/0401* (2013.01); *H01L 2224/131* (2013.01); *H01L 2224/16238* (2013.01); *H01L 2224/81447* (2013.01); *H01L 2224/97* (2013.01); *H01L 2924/157* (2013.01);

(Continued)

(58) Field of Classification Search
CPC ............. H01L 23/5227; H01L 23/3114; H01L 23/49827; H01L 23/49838; H01L 23/5223; H01L 21/4853; H01L 21/486; H01L 21/565; H01L 2021/60022
USPC ...................................................... 257/531
See application file for complete search history.

(56) References Cited

U.S. PATENT DOCUMENTS

| 7,238,603 B2 | 7/2007 | Iijima et al. |
| 2005/0082592 A1* | 4/2005 | Chang ................. H01L 23/5223 257/306 |

(Continued)

*Primary Examiner* — Tu-Tu Ho
(74) *Attorney, Agent, or Firm* — Foley & Lardner LLP; Cliff Z. Liu

(57) ABSTRACT

A semiconductor device includes a substrate, at least one integrated passive device, a first redistribution layer, a second redistribution layer, and conductive vias. The at least one integrated passive device includes at least one capacitor disposed adjacent to a first surface of the substrate. The first redistribution layer is disposed adjacent to the first surface of the substrate. The second redistribution layer is disposed adjacent to a second surface of the substrate. The conductive vias extend through the substrate, and electrically connect the first redistribution layer and the second redistribution layer.

22 Claims, 15 Drawing Sheets

(51) Int. Cl.
*H01L 23/498* (2006.01)
*H01L 21/60* (2006.01)
*H01L 23/00* (2006.01)

(52) U.S. Cl.
CPC ............ *H01L 2924/15311* (2013.01); *H01L 2924/15788* (2013.01)

(56) References Cited

U.S. PATENT DOCUMENTS

| | | |
|---|---|---|
| 2006/0071345 A1 | 4/2006 | Chiu et al. |
| 2012/0056680 A1* | 3/2012 | Kim .................... H01F 17/0013 330/307 |
| 2012/0119373 A1* | 5/2012 | Hunt ..................... H01L 21/565 257/774 |
| 2014/0177189 A1* | 6/2014 | Liu ....................... H01L 23/481 361/760 |
| 2015/0200162 A1* | 7/2015 | Constantino ............ H01L 23/66 257/532 |
| 2016/0260693 A1* | 9/2016 | Lin ........................ H01L 24/19 |

* cited by examiner

SEMICONDUCTOR DEVICE AND METHOD FOR MANUFACTURING THE SAME

CROSS-REFERENCE TO RELATED PATENT APPLICATIONS

This application claims the benefit of and priority to U.S. Provisional Patent Application 62/238,341 filed Oct. 7, 2015, the contents of which are incorporated herein by reference in their entirety.

BACKGROUND

1. Field of the Disclosure

The present disclosure relates to the field of semiconductor devices and semiconductor processes, and more particularly, to semiconductor devices having an integrated passive device and semiconductor processes for manufacturing the same.

2. Description of the Related Art

A conventional circuit may include one or more passive devices, where a passive device is a component such as a capacitor, a resistor or an inductor. To achieve microminiaturization, there is a trend to integrate passive devices into a semiconductor device. However, an inductor is a spiral structure, and when integrated by disposing the inductor on a surface of an insulation layer, the spiral structure can occupy a large space.

SUMMARY

In an embodiment, a semiconductor device includes a substrate, at least one integrated passive device, a first redistribution layer, a second redistribution layer, and conductive vias. The at least one integrated passive device includes at least one capacitor disposed adjacent to the first surface of the substrate. The first redistribution layer is disposed adjacent to a first surface of the substrate. The second redistribution layer is disposed adjacent to a second surface of the substrate. The conductive vias extend through the substrate, and electrically connect the first redistribution layer and the second redistribution layer.

In an embodiment, a semiconductor device includes a substrate, integrated passive devices, a first segment disposed adjacent to a first surface of the substrate, a second segment disposed adjacent to a second surface of the substrate, and conductive vias. The integrated passive devices include an inductor, and at least one capacitor disposed adjacent to the first surface of the substrate. The conductive vias extend through the substrate. Each of the conductive vias has a first end adjacent to the first surface of the substrate and a second end adjacent to the second surface of the substrate. The first segment electrically connects first ends of a first one and a second one of the conductive vias, and the second segment electrically connects second ends of the second one and a third one of the conductive vias. The inductor includes a series electrical connection of the first one, the second one and the third one of the conductive vias.

In an embodiment, a method for manufacturing a semiconductor device includes: (a) providing a substrate having a first surface and a second surface; (b) forming a plurality of conductive vias in the substrate; (c) forming at least one capacitor adjacent to the first surface of the substrate; (d) forming a first redistribution layer adjacent to the first surface of the substrate; (e) forming a second redistribution layer adjacent to the second surface of the substrate, the second redistribution layer electrically connected to the first redistribution layer through the conductive vias; and (f) attaching a semiconductor chip adjacent to the first surface of the substrate, the semiconductor chip electrically connected to the first redistribution layer.

DETAILED DESCRIPTION

An inductor integrated into a semiconductor device is typically a spiral structure (a coil) disposed on a surface of an insulation layer. That is, the spiral structure is two-dimensional, and can occupy a large space of the layout. Further, in a package structure of the semiconductor device, a redistribution layer (RDL) including the integrated spiral structure of the inductor is disposed on one side of an interposer or a substrate, with conductive through vias providing electrical connection from one side of the interposer or the substrate to the opposite side of the interposer or the substrate. In other words, one end of a conductive through via connects to the RDL, and the other end of the conductive through via connects to a pad (e.g., a bump pad or ball pad) on which an external connective component (e.g., a respective bump or solder ball) is disposed for external connection.

To address the above concerns, the present disclosure provides an improved semiconductor device having an integrated three-dimensional inductor, and improved techniques for manufacturing the semiconductor device. The three-dimensional inductor includes conductive through vias that connect an RDL on one side of the interposer or the substrate with another RDL on an opposite side of the interposer or the substrate. Because most of the path of the three-dimensional inductor is contributed by the conductive through vias that are disposed in the interposer or the substrate, the three-dimensional inductor will have smaller dimensions in a plane along an upper surface of the semiconductor device relative to a two-dimensional implementation on a surface of an insulator of the semiconductor device. Thus, dimensions of the semiconductor device may be reduced.

Figure 1:
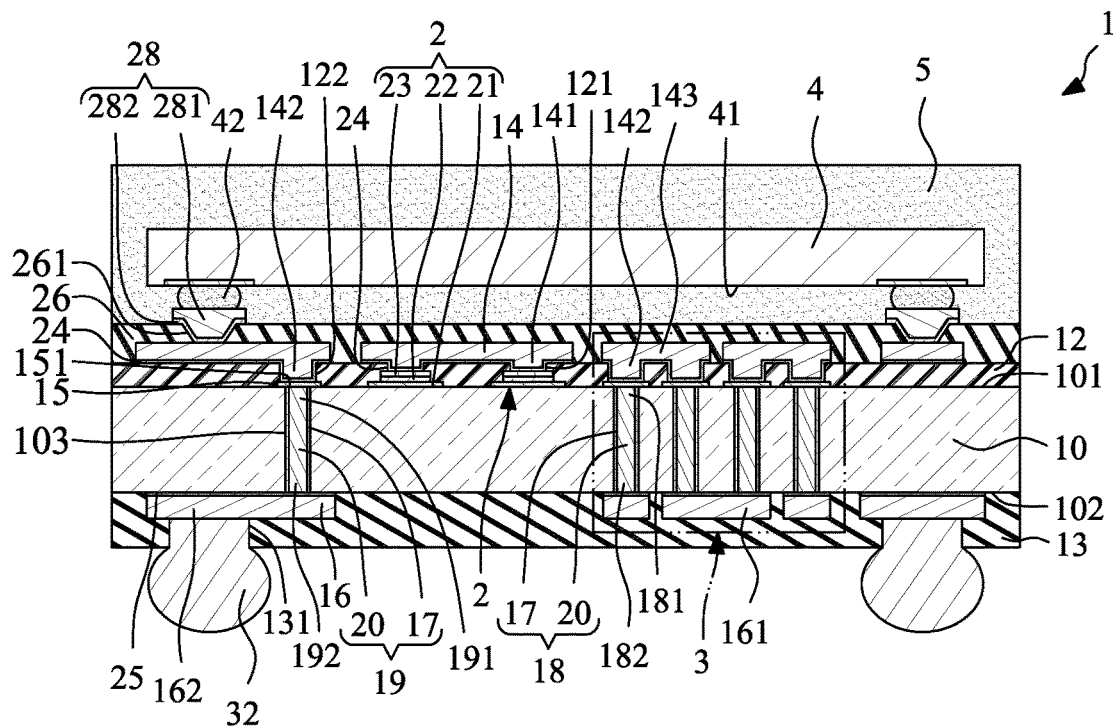
FIG. 1 illustrates a cross-sectional view of a semiconductor device according to an embodiment of the present disclosure.

FIG. 1 illustrates a cross-sectional view of a semiconductor device 1 according to an embodiment of the present disclosure. The semiconductor device 1 includes a substrate 10, at least one integrated passive device (e.g., a capacitor 2 and/or an inductor 3), a first insulation layer 12, a second insulation layer 13, a first RDL 14, a second RDL 16 and conductive vias 18, 19.

The substrate 10 has a first surface 101 and a second surface 102 opposite to the first surface 101, and defines through holes 103. In one or more embodiments, the substrate 10 is an interposer made of glass, silicon or silica. That is, the substrate 10 in such embodiments may be cut from a glass wafer, a silicon wafer or a silica wafer.

Each of the conductive vias 18, 19 is disposed in respective ones of the through holes 103, extends through the substrate 10, and electrically connects the first RDL 14 and the second RDL 16. In one or more embodiments, the conductive vias 18, 19 each include a first seed layer 17 on the side wall of the through hole 103, and a first metal layer 20 on the first seed layer 17. In some embodiments, the first seed layer 17 is omitted. In one or more embodiments, a material of the first seed layer 17 is an alloy of titanium (Ti) and copper (Cu), such as TiCu, and a material of the first metal layer 20 is Cu. Other suitable metals or metal alloys can be used.

Each of the conductive vias 18 has a first end 181 adjacent to the first surface 101 of the substrate 10 and a second end 182 adjacent to the second surface 102 of the substrate 10. Each of the conductive vias 19 has a first end 191 adjacent to the first surface 101 of the substrate 10 and a second end 192 adjacent to the second surface 102 of the substrate 10.

The capacitor 2 is disposed adjacent to the first surface 101 of the substrate 10. In the embodiment illustrated in FIG. 1, there are two capacitors 2 disposed on the first surface 101 of the substrate 10. Each of the capacitors 2 includes a lower electrode 21, a dielectric layer 22 and an upper electrode 23. The lower electrode 21 is disposed on the first surface 101 of the substrate 10. The dielectric layer 22 is disposed on the lower electrode 21. The upper electrode 23 is disposed on the dielectric layer 22. That is, the dielectric layer 22 is disposed between the lower electrode 21 and the upper electrode 23. In one or more embodiments, the lower electrode 21 and the upper electrode 23 include an alloy of aluminum (Al) and Cu, such as AlCu, and the dielectric layer 22 includes a tantalum (Ta) alloy or compound, such as tantalum pentoxide ($Ta_2O_5$), or Ta with $Ta_2O_5$. A dimension (e.g., width, length, or surface area) of the upper electrode 23 is substantially the same as a corresponding dimension (e.g., width, length, or surface area) of the dielectric layer 22. In one or more embodiments, and as shown in FIG. 1, a dimension (e.g., width, length, or surface area) of the lower electrode 21 is greater than the corresponding dimensions of the upper electrode 23 and the dielectric layer 22. In other embodiments, a dimension of the lower electrode 21 is substantially the same as corresponding dimensions of the upper electrode 23 and the dielectric layer 22. In the illustration of FIG. 1, a structure and corresponding dimensions of the two capacitors 2 are substantially the same; however, in other embodiments, the structure and corresponding dimensions of the two capacitors 2 may be different.

The semiconductor device 1 further includes contact pads 151. The contact pads 151 are disposed on the first surface 101 of the substrate 10 and on the first ends of each of the conductive vias 18, 19. The contact pads 151 and the lower electrode 21 are portions of a same patterned circuit layer 15, that is, they are formed at the same time. In one or more embodiments, the contact pads 151 are omitted. In one or more embodiments in which a material of the substrate 10 is a semiconductor material, a barrier layer (not shown) is disposed between the patterned circuit layer 15 and the substrate 10.

The first insulation layer 12 covers the capacitors 2 and the first surface 101 of the substrate 10, and defines first openings 121 and second openings 122. The first openings 121 expose a portion of the upper electrode 23 of the capacitor 2. The second openings 122 correspond to the conductive vias 18, 19 and expose the contact pads 151. In one or more embodiments, the first insulation layer 12 includes a polymer such as benzocyclobutene (BCB), polyimide (PI), polypropylene (PP) or epoxy. However, in other embodiments, a material of the first insulation layer 12 may be, for example, silicon oxide or silicon nitride.

The first RDL 14 is disposed on the first insulation layer 12, and includes first conductive interconnectors 141, second conductive interconnectors 142 and first segments 143. That is, the first conductive interconnectors 141, the second conductive interconnectors 142 and the first segments 143 are portions of the first RDL 14. The first conductive interconnector 141 is disposed in the first opening 121 of the first insulation layer 12 to electrically connect to the upper electrode 23 of the capacitor 2. The second conductive interconnector 142 is disposed in the second opening 122 of the first insulation layer 12 to electrically connect to the conductive vias 18, 19 through the contact pads 151.

The first segments 143 are disposed on the first conductive interconnectors 141 and the second conductive interconnectors 142 to electrically connect ones of the first conductive interconnectors 141 or ones of the second conductive interconnectors 142. An optional second seed layer 24 is disposed between the first RDL 14 and the first insulation layer 12. The second seed layer 24 may be omitted. In the embodiment illustrated in FIG. 1, the second seed layer 24 is disposed between the second conductive interconnector 142 and the contact pads 151, and between the first segments 143 and the first insulation layer 12. A material of the second seed layer 24 may be TiCu. The conductive interconnectors 141, 142 and the first segments 143 may be Cu or other suitable metal or metal alloy, and conductive interconnectors 141, 142 and the first segments 143 may be formed concurrently.

As shown in FIG. 1, within the inductor 3, one first segment 143 electrically connects two first ends 181 of corresponding conductive vias 18 through the second conductive interconnectors 142 and the contact pads 151. Therefore, the conductive vias 18 are electrically connected in series.

The second RDL 16 is disposed adjacent to the second surface 102 of the substrate 10, and includes second segments 161 and connection pads 162. In one or more embodiments in which a material of the substrate 10 is semiconductor material, a barrier layer (not shown) is disposed between the second RDL 16 and the substrate 10. In the embodiment illustrated in FIG. 1, a third seed layer 25 is disposed between the second RDL 16 (including the second segments 161 and the connection pads 162) and the substrate 10. The third seed layer 25 may be omitted. In one or more embodiments, a material of the third seed layer 25 is TiCu;

and a material of the second RDL 16 (including the second segments 161 and the connection pads 162) is Cu or other metal or metal alloy.

The second segments 161 are disposed adjacent to the second surface 102 of the substrate 10 to electrically connect two second ends 182 of corresponding conductive vias 18. Therefore, by the first segments 143, the second conductive interconnectors 142, and the contact pads 151, the conductive vias 18 are electrically connected in series to form the inductor 3. That is, the inductor 3 includes the second segments 161, the conductive vias 18, the first segments 143, the second conductive interconnectors 142 and the contact pads 151. The second segments 161 and the first segments 143 are misaligned (to electrically connect different pairs of conductive vias 18), so that the inductor 3 is in a serpentine pattern along a plane that is substantially perpendicular to the first surface 101 and the second surface 102 of the substrate 10 (e.g., a plane parallel to the page on which FIG. 1 is illustrated). That is, the inductor 3 is a three-dimensional inductor.

The second insulation layer 13 covers the second RDL 16 and the second surface 102 of the substrate 10, and defines openings 131 to expose the connection pads 162. In one or more embodiments, the second insulation layer 13 includes a polymer such as BCB, PI, PP or epoxy. In other embodiments, a material of the second insulation layer 13 may be, for example, silicon oxide or silicon nitride.

As shown in FIG. 1, the semiconductor device 1 further includes a protection layer 26, first under-bump metallurgies (UBMs) 28, a semiconductor chip 4, an encapsulant 5 and external connection elements 32. The protection layer 26 covers the first segments 143 and the first insulation layer 12, and defines openings 261 to expose portions (e.g., connection pads) of the first segments 143. In one or more embodiments, the protection layer 26 includes a polymer such as BCB, PI, PP, epoxy or solder mask. The first UBMs 28 are disposed in the openings 261 to electrically connect to the exposed portions (e.g., connection pads) of the first segments 143. In the embodiment illustrated in FIG. 1, the first UBM 28 includes a third RDL 281, and a fourth seed layer 282 disposed between the third RDL 281 and the protection layer 26. The fourth seed layer 282 may be omitted. In one or more embodiments, the fourth seed layer 282 is TiCu and a material of the third RDL 281 is Cu.

The semiconductor chip 4 is disposed adjacent to and electrically connected to the first RDL 14. In the embodiment illustrated in FIG. 1, the semiconductor chip 4 includes connection elements 42 (e.g., bumps or solder balls) adjacent to an active surface 41 thereof. The connection elements 42 connect to the first UBMs 28. That is, the semiconductor chip 4 is electrically connected to the first RDL 14 by flip-chip bonding. The encapsulant 5 covers the semiconductor chip 4 and the protection layer 26.

The external connection elements 32 (e.g., bumps or solder balls) are disposed in the openings 131 of the second insulation layer 13 to contact the connection pads 162 for external connection.

In the embodiment illustrated in FIG. 1, the first RDL 14 and the second RDL 16 are disposed on opposite sides of the substrate 10. In addition, portions of the first RDL 14 and the second RDL 16 are electrically connected by the conductive vias 18 extending vertically through the substrate 10 (in the orientation illustrated) to form the three-dimensional inductor 3. Therefore, the three-dimensional inductor 3 will not occupy a large space on a surface parallel to the first surface 101 of the substrate 10 (e.g., an upper surface of the first insulation layer 12).

Figure 2:
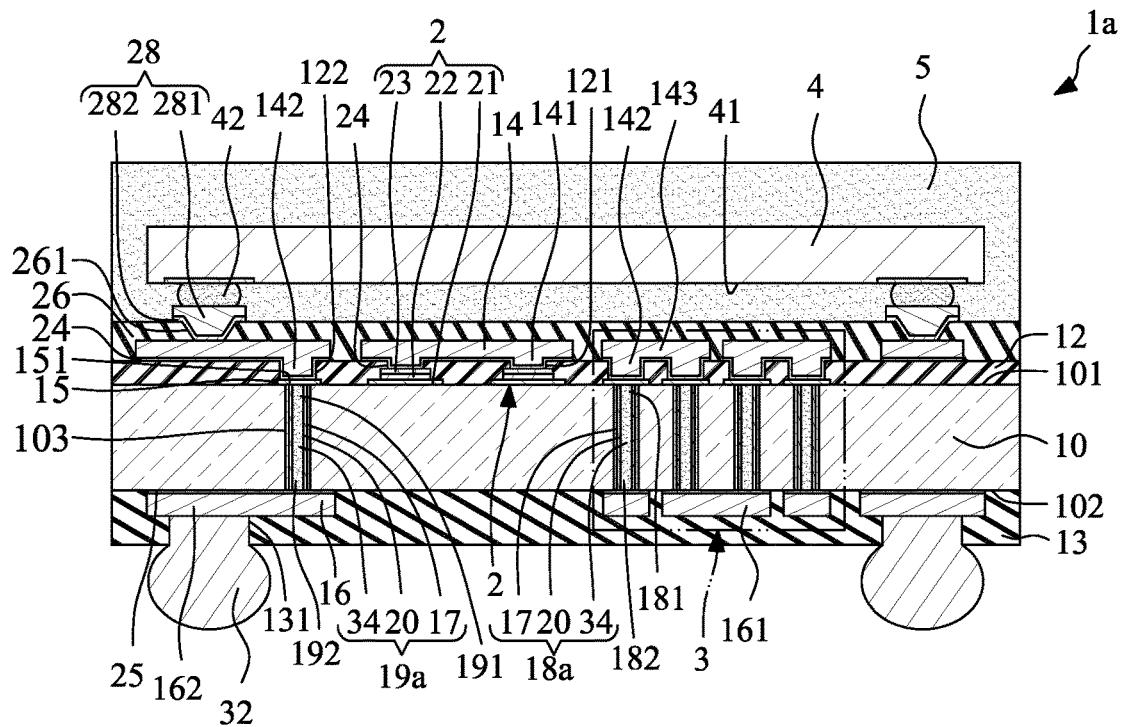
FIG. 2 illustrates a cross-sectional view of a semiconductor device according to an embodiment of the present disclosure.

FIG. 2 illustrates a cross-sectional view of a semiconductor device 1a according to an embodiment of the present disclosure. The semiconductor device 1a is similar to the semiconductor device 1 as shown in FIG. 1, with differences including different structures of conductive vias 18a, 19a as compared to the conductive vias 18, 19 of FIG. 1. The conductive vias 18a, 19a of FIG. 2 include a conductor material (e.g., the first seed layer 17 and the first metal layer 20) and an inner insulation layer 34. As shown in FIG. 2, the first seed layer 17 of the conductor material is disposed on the side wall of the through hole 103, the first metal layer 20 is disposed on the first seed layer 17 to define a central groove, and the central groove is filled with the inner insulation layer 34.

Figure 3:
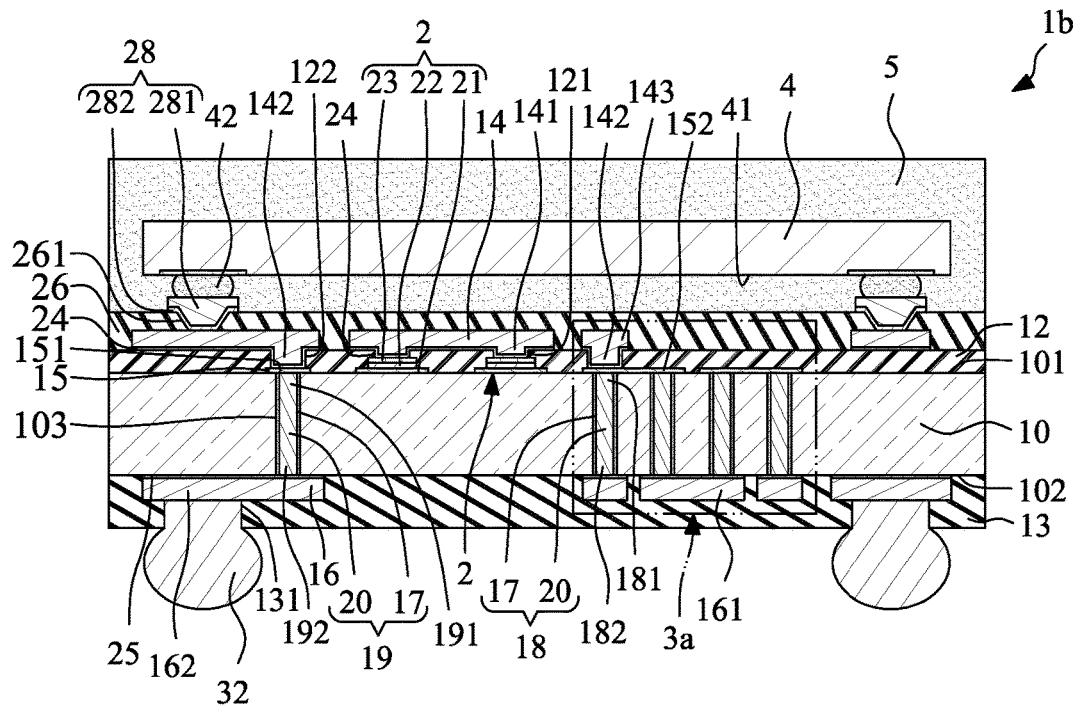
FIG. 3 illustrates a cross-sectional view of a semiconductor device according to an embodiment of the present disclosure.

FIG. 3 illustrates a cross-sectional view of a semiconductor device 1b according to an embodiment of the present disclosure. The semiconductor device 1b is similar to the semiconductor device 1 as shown in FIG. 1, with differences including a different structure for an inductor 3a as compared to the inductor 3 in FIG. 1. As shown in FIG. 3, the patterned circuit layer 15 further includes third segments 152. Two first ends 181 of the corresponding conductive vias 18 are electrically connected in series by a corresponding third segment 152 rather than a first segment 143 as illustrated in FIG. 1. Therefore, the inductor 3a will not occupy any space on the upper surface of the first insulation layer 12.

Figure 4:
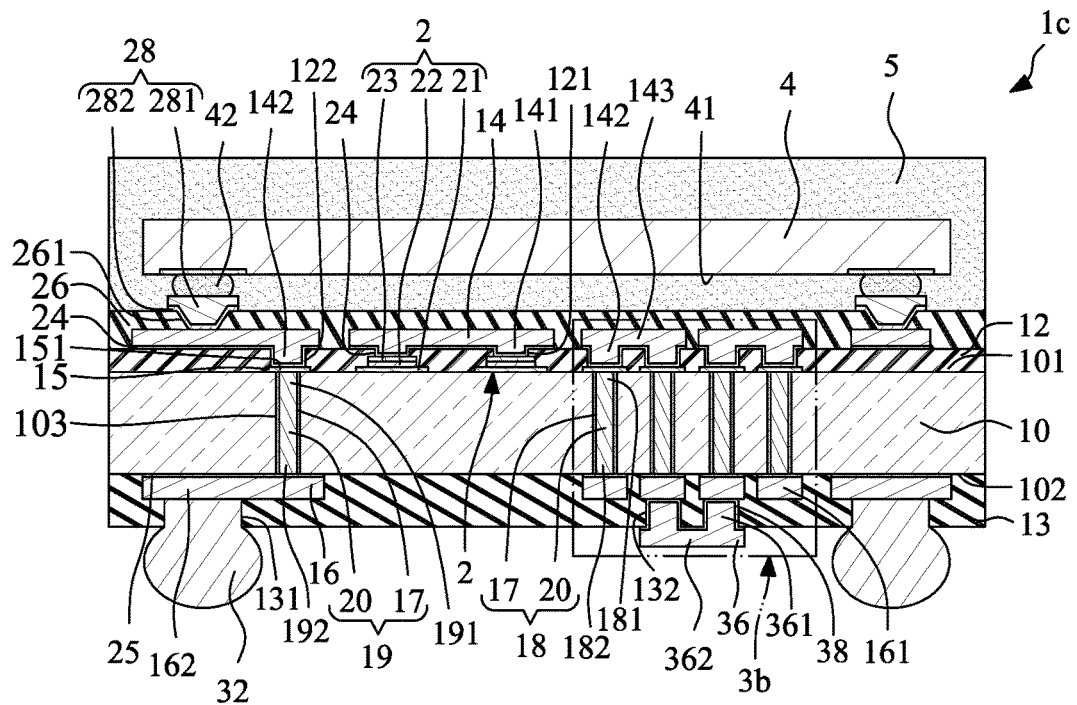
FIG. 4 illustrates a cross-sectional view of a semiconductor device according to an embodiment of the present disclosure.

FIG. 4 illustrates a cross-sectional view of a semiconductor device 1c according to an embodiment of the present disclosure. The semiconductor device 1c is similar to the semiconductor device 1 as shown in FIG. 1, with differences including a different structure for an inductor 3b as compared to the inductor 3 in FIG. 1. As shown in FIG. 4, the semiconductor device 1c further includes a fourth RDL 36 disposed on the second insulation layer 13, and the second insulation layer 13 further defines openings 132. Further, the second segments 161 of the second RDL 16 in the inductor 3b do not electrically connect two second ends 182 of corresponding conductive vias 18.

The fourth RDL 36 includes third conductive interconnectors 361 and fourth segments 362. That is, the third conductive interconnectors 361 and the fourth segments 362 are portions of the fourth RDL 36. The third conductive interconnector 361 is disposed in the second opening 132 of the second insulation layer 13 to electrically connect two second ends 182 of corresponding conductive vias 18 through the second segments 161 of the second RDL 16. The fourth segments 362 are disposed adjacent to the second insulation layer 13 and on the third conductive interconnectors 361 to electrically connect to the third conductive interconnectors 361. In one or more embodiments, a fifth seed layer 38 is disposed between the third conductive interconnector 361 and the second insulation layer 13. The fifth seed layer 38 may be omitted. In the embodiment illustrated in FIG. 4, the fifth seed layer 38 is disposed between the fourth segments 362 and the second insulation layer 13. In one or more embodiments, a material of the fifth seed layer 38 is TiCu. In one or more embodiments, a material of the third conductive interconnectors 361 and the fourth segments 362 is Cu, and the third conductive interconnectors 361 and the fourth segments 362 are formed concurrently.

By the first segments 143, the second conductive interconnectors 142, the contact pads 151, the second segments 161 of the second RDL 16, the third conductive interconnectors 361 and the fourth segments 362, the conductive vias 18 are electrically connected in series to form the inductor 3b. That is, the inductor 3b includes the third conductive interconnectors 361, the fourth segments 362, the conductive vias 18, the first segments 143, the second conductive interconnectors 142 and the contact pads 151. The fourth segments 362 and the first segments 143 are misaligned (to electrically connect different pairs of conductive vias 18), so that the inductor 3b is in a serpentine pattern along a plane that is substantially perpendicular to the first surface 101 and the second surface 102 of the substrate 10 (e.g., a plane parallel to the page on which FIG. 4 is illustrated). That is, the inductor 3b is a three-dimensional inductor with increased path length as compared to the inductor 3 of FIG. 1.

Figure 5:
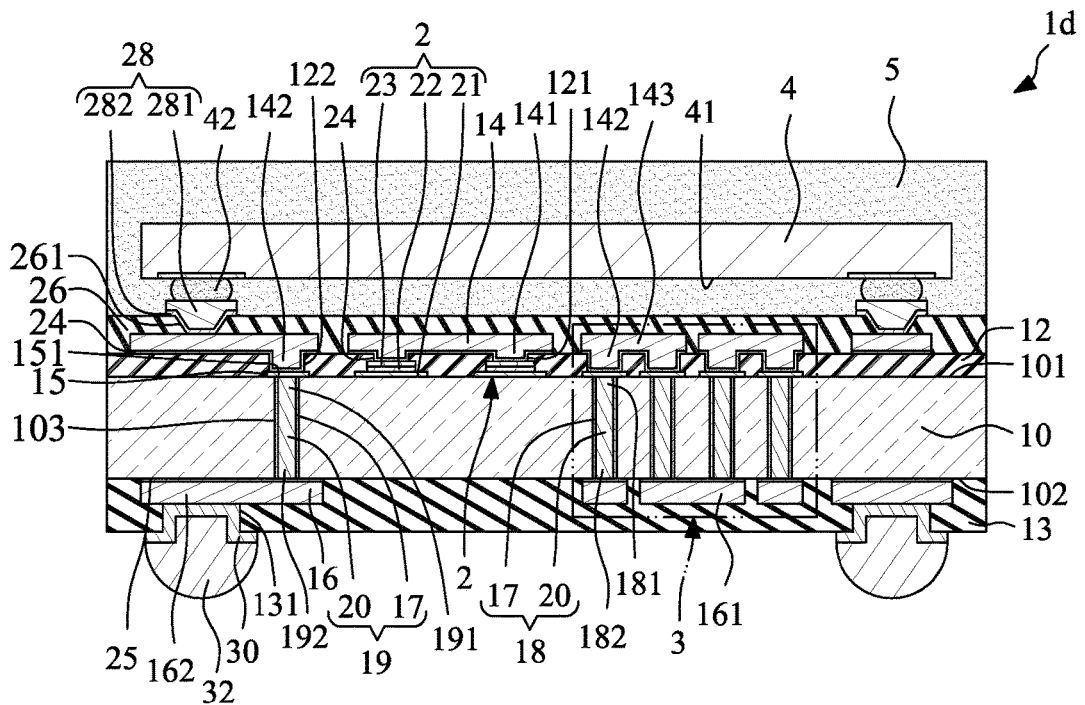
FIG. 5 illustrates a cross-sectional view of a semiconductor device according to an embodiment of the present disclosure.

FIG. 5 illustrates a cross-sectional view of a semiconductor device 1d according to an embodiment of the present disclosure. The semiconductor device 1d is similar to the semiconductor device 1 as shown in FIG. 1, with differences including that the semiconductor device 1d further includes second UBMs 30. The second UBMs 30 are disposed in the openings 131 of the second insulation layer 13 to contact the connection pads 162. The external connection elements 32 (e.g., bumps or solder balls) are disposed on the second UBMs 30 for external connection.

Figure 6:
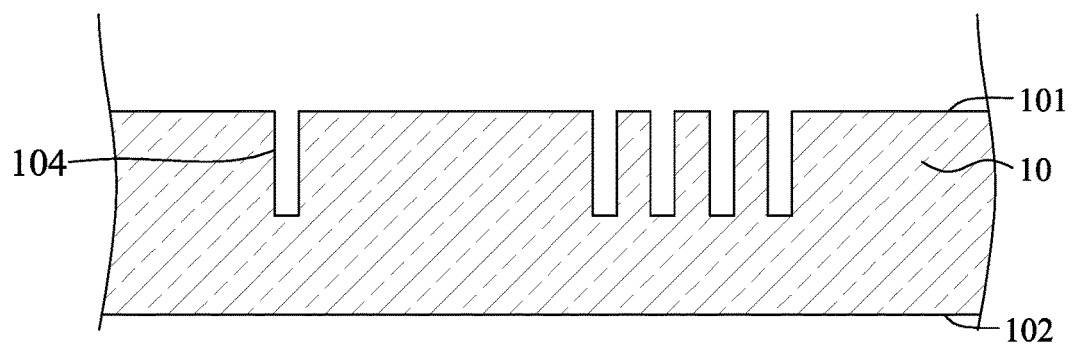
FIG. 6, FIG. 7, FIG. 8, FIG. 9, FIG. 10, FIG. 11, FIG. 12, FIG. 13, FIG. 14, FIG. 15, FIG. 16, FIG. 17 and FIG. 18 illustrate a method for manufacturing a semiconductor device according to an embodiment of the present disclosure.

FIGS. 6 to 18 illustrate a method for manufacturing a semiconductor device according to an embodiment of the present disclosure. Referring to FIG. 6, a substrate 10 is provided. The substrate 10 has a first surface 101 and a second surface 102 opposite to the first surface 101. In one or more embodiments, the substrate 10 may be an interposer made of glass, silicon or silica. That is, for example, the substrate 10 may be a glass wafer, a silicon wafer or a silica wafer. In the embodiment illustrated in FIG. 6, the substrate 10 is made of glass, and a thickness of the substrate 10 is about 700 micrometers (μm). Blind holes 104 are formed in the substrate 10 from the first surface 101. In one or more embodiments, a diameter of a blind hole 104 is about 60 μm, and a depth of the blind hole 104 is about 280 μm.

Figure 7:
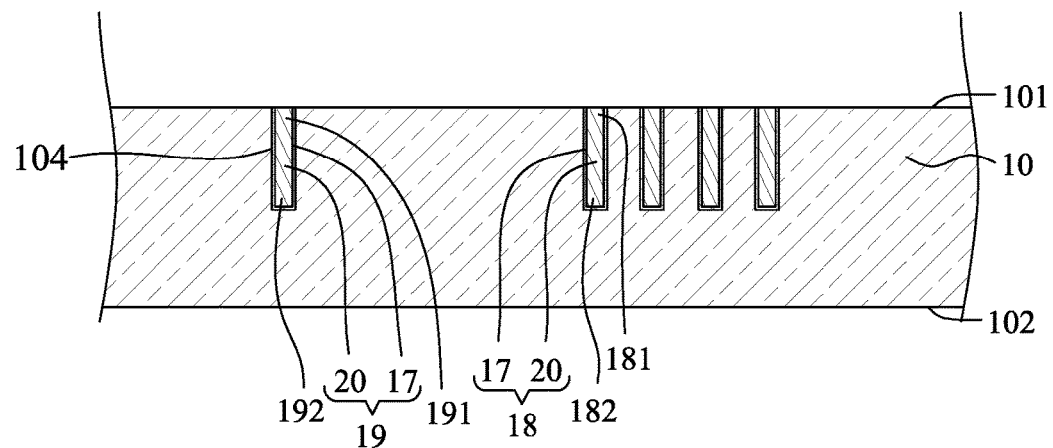

Referring to FIG. 7, a first seed layer 17 is formed on a side wall of the blind hole 104 and on the first surface 101 of the substrate 10, such as by sputtering (e.g., by physical vapor deposition (PVD)). Then, a first metal layer 20 is formed on the first seed layer 17, such as by plating, to fill the blind hole 104. In one or more embodiments, a material of the first seed layer 17 is TiCu (e.g., a layer of Ti with a thickness of about 0.75 μm and a layer of Cu with a thickness of about 2.5 μm), and a material of the first metal layer 20 is Cu. A removal technique, such as chemical mechanical polishing (CMP), is performed to remove the Cu outside the blind hole 104, and a removal technique, such as wet etching, is performed to remove the Ti outside the blind hole 104. In this manner, conductive vias 18, 19 are formed in respective ones of the blind holes 104. Each of the conductive vias 18 has a first end 181 adjacent to the first surface 101 of the substrate 10 and a second end 182 adjacent to the second surface 102 of the substrate 10. Each of the conductive vias 19 has a first end 191 adjacent to the first surface 101 of the substrate 10 and a second end 192 adjacent to the second surface 102 of the substrate 10.

Figure 8:
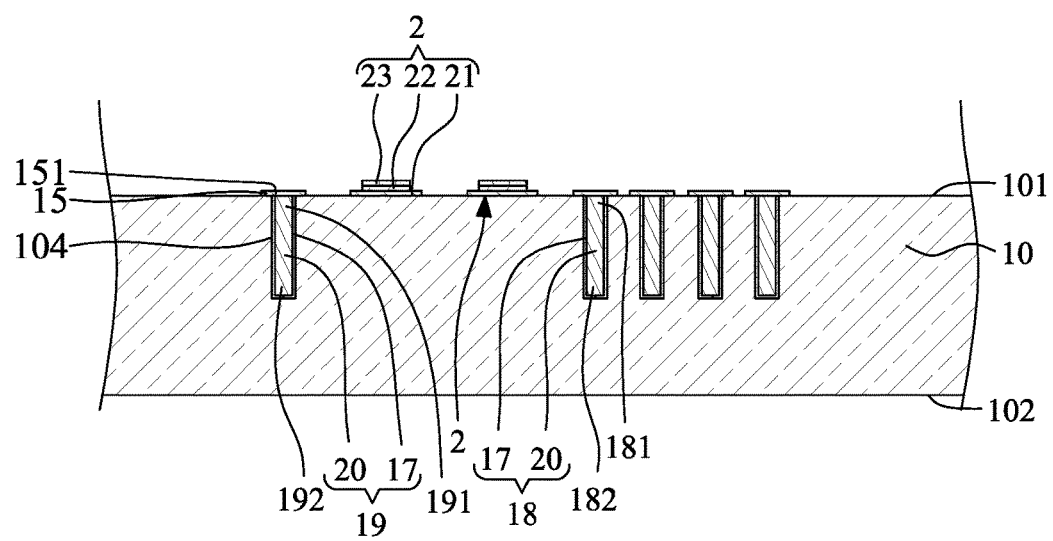

Referring to FIG. 8, a first metal layer (which will become a patterned conductive layer 15 including lower electrodes 21 and contact pads 151) is formed on the first surface 101 of the substrate 10 and on the conductive vias 18, 19, such as by sputtering. In one or more embodiments, a material of the first metal layer is AlCu, and a thickness of the first metal layer is about 1 μm. Next, a second metal layer (which will become dielectric layers 22 after oxidation) is formed on the first metal layer, such as by sputtering. In one or more embodiments, a material of the second metal layer is Ta, and a thickness of the second metal layer is about 0.3 μm. Thereafter, the second metal layer is treated (e.g., oxidized and/or thickened) so that the second metal layer becomes an insulation or dielectric layer (e.g., $Ta_2O_5$) having a thickness of about 0.407 μm. Thereafter, a third metal layer (which will become upper electrodes 23) is formed on the second metal layer, such as by sputtering. In one or more embodiments, a material of the third metal layer is AlCu, and a thickness of the third metal layer is about 1 μm.

A first photoresist layer (not shown, and subsequently removed) is formed on the third metal layer in a pattern. Then, the third metal layer and the second metal layer are selectively removed according to the pattern of the first photoresist layer, such as by dry etching. Then, the first photoresist layer is removed to form the dielectric layers 22 (corresponding to the second metal layer) and the upper electrodes 23 (corresponding to the third metal layer).

Next, a second photoresist layer (not shown, and subsequently removed) is formed on the first metal layer and the upper electrode 23 in a pattern. Then, the first metal layer is selectively removed according to the pattern of the second photoresist layer, such as by dry etching. Then, the second photoresist layer is removed so as to form the patterned circuit layer 15 (corresponding to the first metal layer) including the lower electrodes 21 and the contact pads 151.

Two capacitors 2 are formed adjacent to the first surface 101 of the substrate 10 by the techniques described with respect to FIG. 8. Each of the capacitors 2 includes a respective lower electrode 21, dielectric layer 22 and upper electrode 23. The lower electrode 21 is disposed on the first surface 101 of the substrate 10. The dielectric layer 22 is disposed on the lower electrode 21. The upper electrode 23 is disposed on the dielectric layer 22. That is, the dielectric layer 22 is disposed between the lower electrode 21 and the upper electrode 23. A dimension (e.g., width, length or area) of the upper electrode 23 is substantially the same as a corresponding dimension (e.g., width, length or area) of the dielectric layer 22. In one or more embodiments, a dimension (e.g., width, length or area) of the lower electrode 21 is greater than the corresponding dimensions of the upper electrode 23 and the dielectric layer 22. In other embodiments, the dimension of the lower electrode 21 is substantially the same as the corresponding dimensions of the upper electrode 23 and the dielectric layer 22. As shown in FIG. 8, dimensions and structure of the two capacitors 2 are substantially the same; however, in other embodiments, the dimensions or structure of the two capacitors 2 may be different.

The contact pads 151 are disposed on the first surface 101 of the substrate 10 and on the first ends of each of the conductive vias 18, 19. In one or more embodiments in which a material of the substrate 10 is a semiconductor material, a barrier layer (not shown) is disposed between the patterned circuit layer 15 and the substrate 10.

Figure 9:
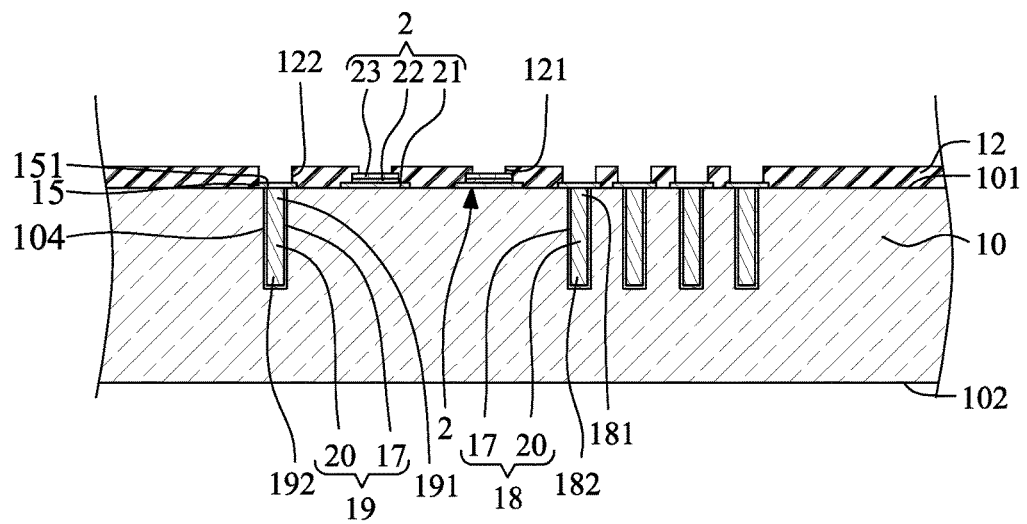

Referring to FIG. 9, a first insulation layer 12 is disposed to cover the capacitors 2 and the first surface 101 of the substrate 10. The first insulation layer 12 defines first openings 121 and second openings 122. The first openings expose portions of the upper electrodes 23 of the capacitors 2. The second openings 122 correspond to the conductive vias 18, 19 and expose portions of the contact pads 151. In one or more embodiments, the first insulation layer 12 includes a polymer such as BCB, PI, PP or epoxy. In other embodiments, a material of the first insulation layer 12 may be, for example, silicon oxide or silicon nitride. In one or more embodiments, a thickness of the first insulation layer 12 is about 3.7 µm.

Figure 10:
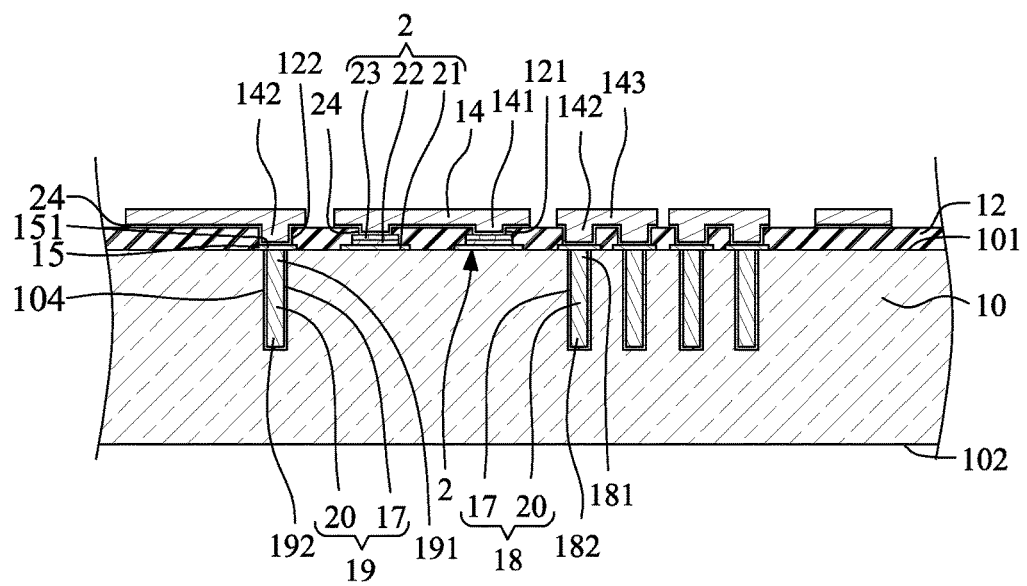

Referring to FIG. 10, an optional second seed layer 24 is disposed over the first insulation layer 12. In one or more embodiments, a material of the second seed layer 24 is TiCu (e.g., a layer of Ti with a thickness of about 0.1 µm and a layer of Cu with a thickness of about 0.2 µm). A first RDL 14 is formed on the first insulation layer 12 or on the second seed layer 24. The first RDL 14 includes first conductive interconnectors 141, second conductive interconnectors 142 and first segments 143. The first conductive interconnector 141 is disposed in the first opening 121 of the first insulation layer 12 to electrically connect to the upper electrode 23 of the capacitor 2. The second conductive interconnector 142 is disposed in the second opening 122 of the first insulation layer 12 to electrically connect to a respective one of the conductive vias 18, 19 through a respective contact pad 151. The first segments 143 are disposed adjacent to the first insulation layer 12 and on the first conductive interconnectors 141 and the second conductive interconnectors 142 to electrically connect ones of the first conductive interconnectors 141 or ones of the second conductive interconnectors 142. In one or more embodiments, a material of the first conductive interconnectors 141, the second conductive interconnectors 142 and the first segments 143 is Cu, and a thickness of the first segment 143 is about 10 µm.

It is to be understood that a third photoresist layer may be used in the formation of the first RDL 14.

Figure 11:
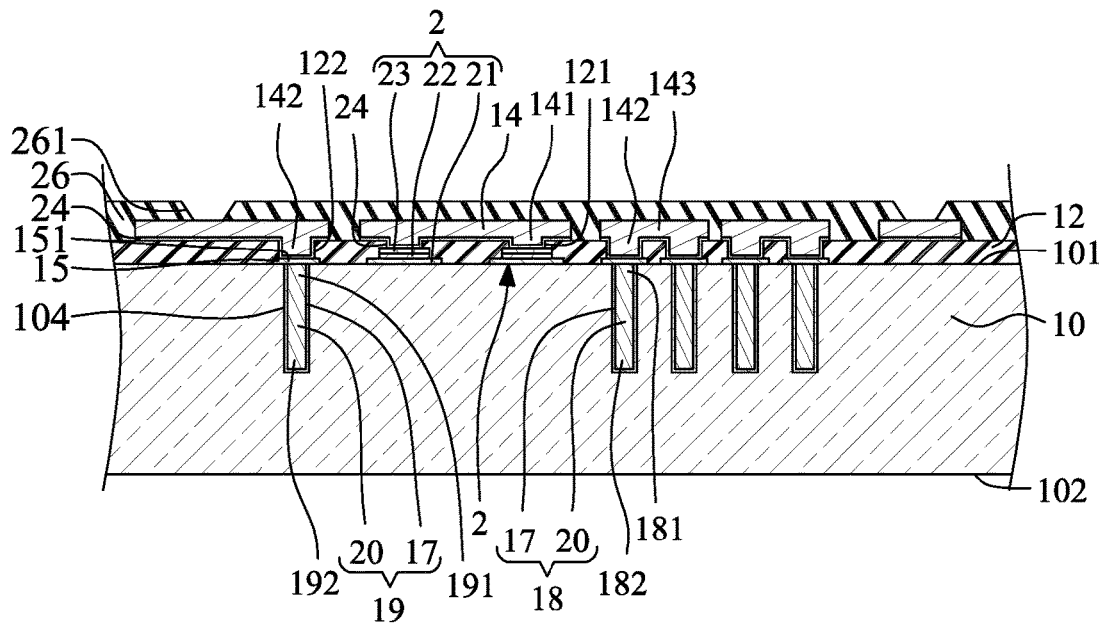

Referring to FIG. 11, a protection layer 26 is formed to cover the first segments 143 and the first insulation layer 12. In one or more embodiments, the protection layer 26 includes a polymer such as BCB, PI, PP, epoxy or a solder mask, and a thickness of the protection layer 26 is about 9.5 µm. The protection layer 26 defines openings 261 to expose portions (e.g., connection pads) of the first segments 143.

Figure 12:
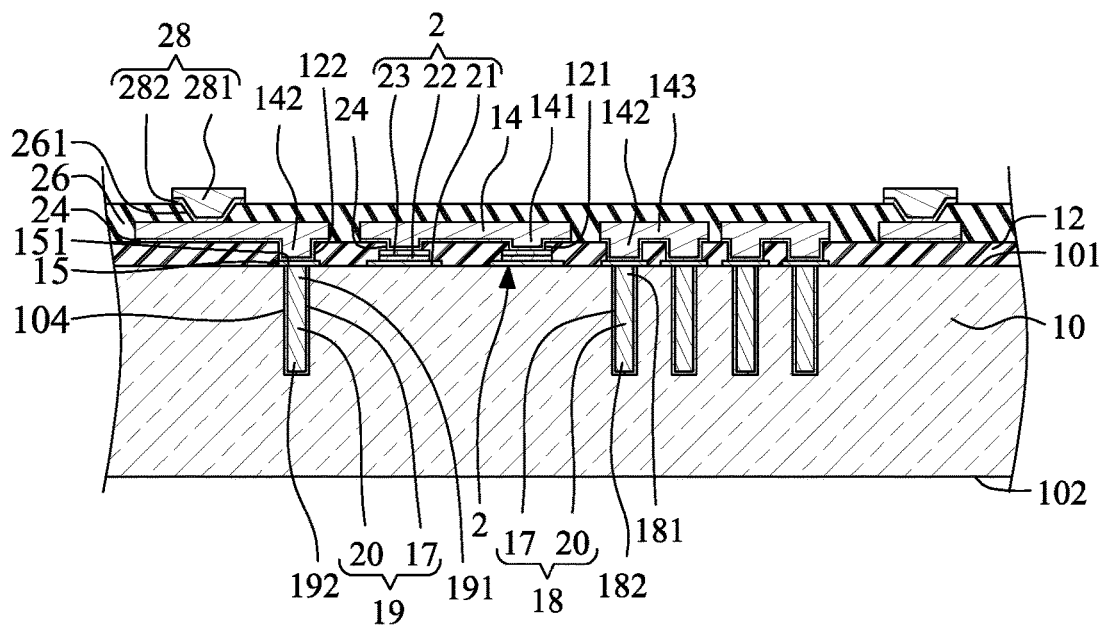

Referring to FIG. 12, first UBMs 28 are formed in the openings 261 of the protection layer 26 to electrically connect to the exposed portions (e.g., connection pads) of the first segments 143. The first UBM 28 includes a third RDL 281 and an optional fourth seed layer 282. The fourth seed layer 282 is formed between the third RDL 281 and the protection layer 26. In one or more embodiments, a material of the third RDL 281 is Cu, and a thickness of the third RDL 281 is about 10.6 µm. In one or more embodiments, a material of the fourth seed layer 282 is TiCu (e.g., a layer of Ti with a thickness of about 0.1 µm and a layer of Cu with a thickness of about 0.2 µm). It is to be understood that a fourth photoresist layer may be used in the formation of the first UBMs 28.

Figure 13:
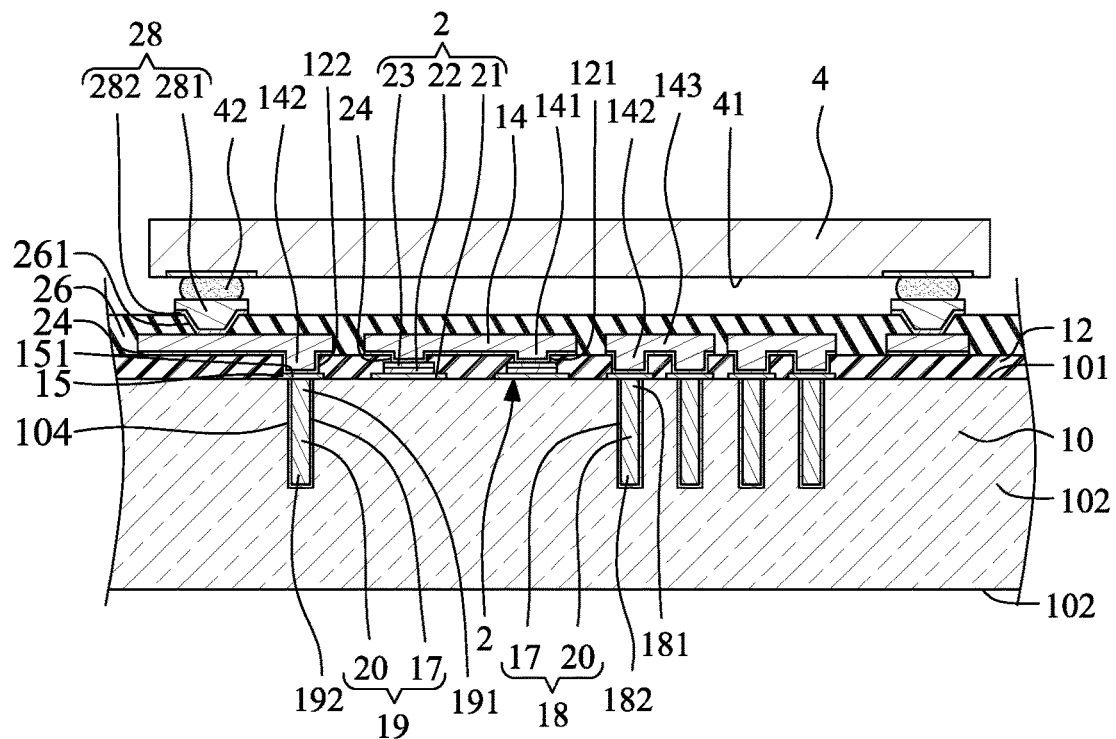

Referring to FIG. 13, a semiconductor chip 4 is disposed adjacent to, and is electrically connected to, the first RDL 14. As shown in FIG. 13, the semiconductor chip 4 includes connection elements 42 (e.g., bumps or solder balls) adjacent to an active surface 41 thereof. The connection elements 42 connect to the first UBMs 28. That is, the semiconductor chip 4 is electrically connected to the first RDL 14 by flip-chip bonding.

Figure 14:
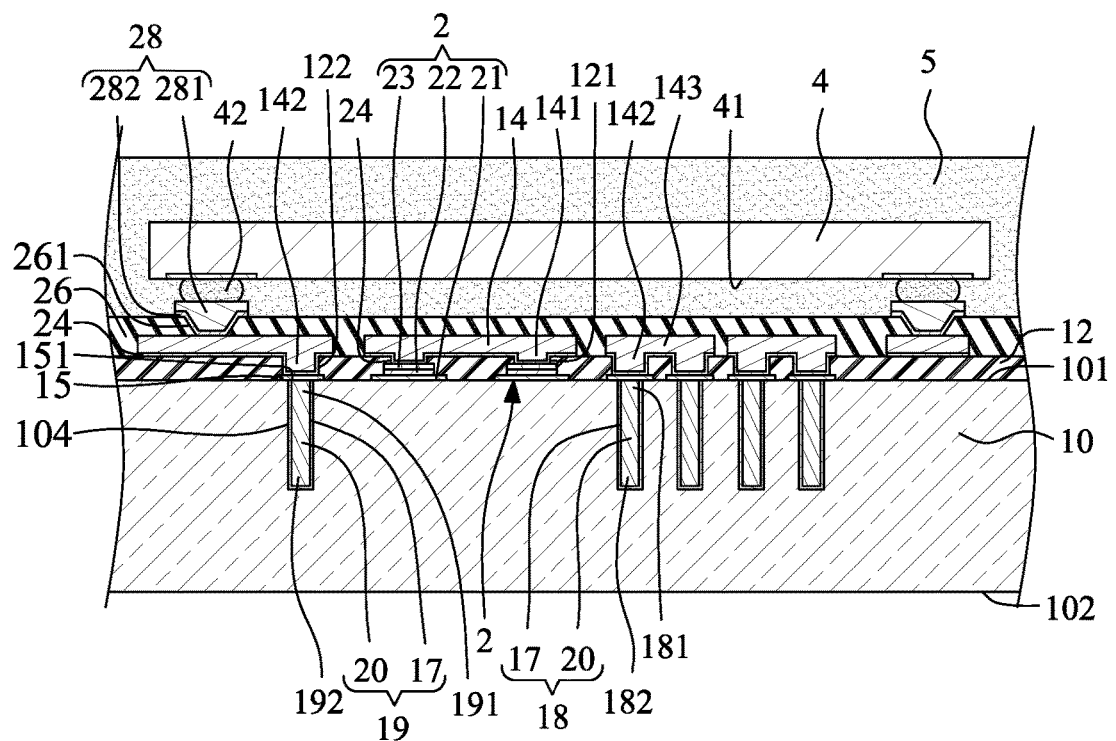

Referring to FIG. 14, an encapsulant 5 is applied to cover the semiconductor chip 4 and the protection layer 26. In one or more embodiments, a material of the encapsulant 5 is a molding compound, and a thickness of the encapsulant 5 is about 450 µm.

Figure 15:
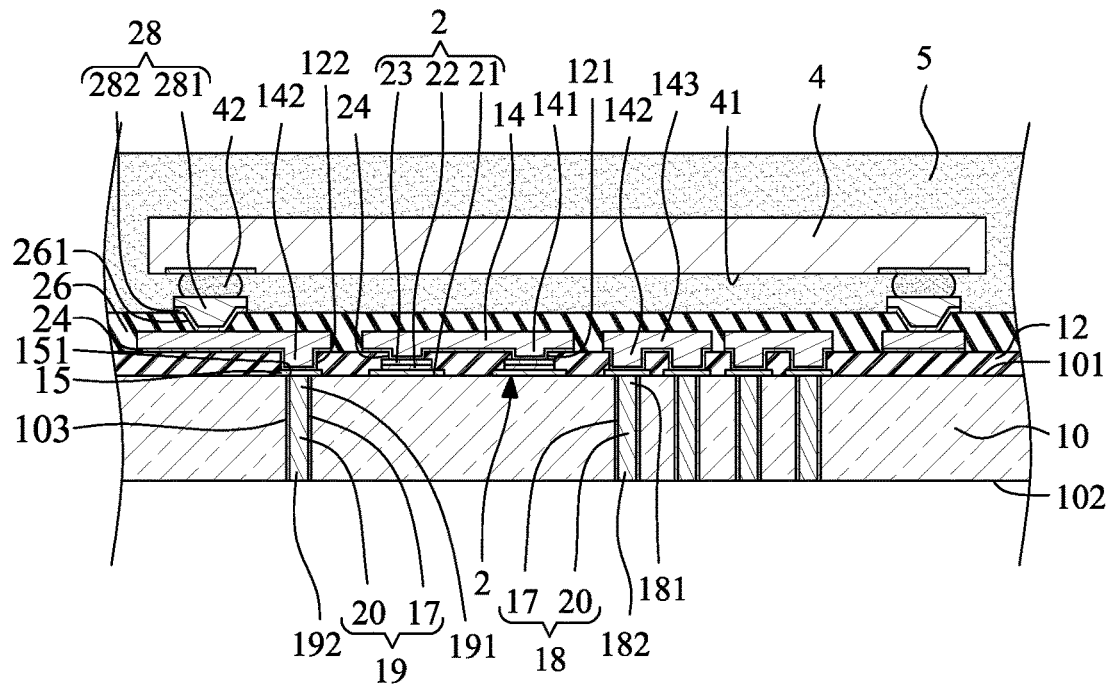

Referring to FIG. 15, the substrate 10 is thinned from the second surface 102 thereof, such as by grinding, to expose the conductive vias 18, 19. In one or more embodiments, a bottom portion of the substrate 10 with a thickness of about 450 µm is removed. Meanwhile, the blind holes 104 become through holes 103.

Figure 16:
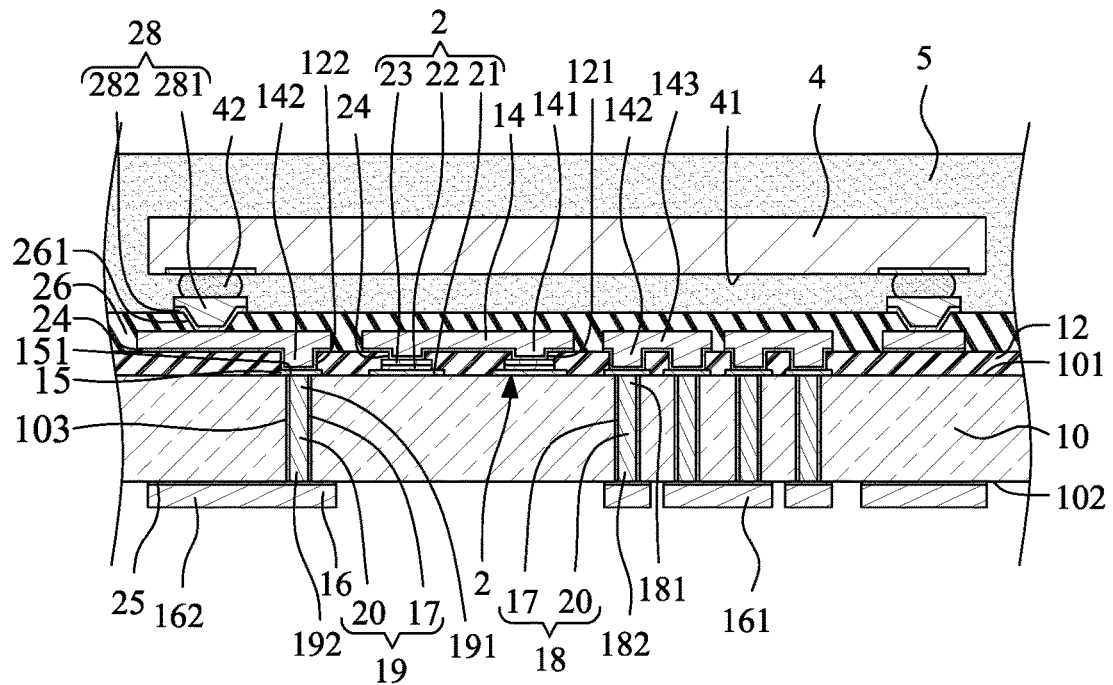

Referring to FIG. 16, a third seed layer 25 is optionally formed on the second surface 102 of the substrate 10. In one or more embodiments, a material of the third seed layer 25 is TiCu (e.g., a layer of Ti with a thickness of about 0.1 µm and a layer of Cu with a thickness of about 0.2 µm). A fifth photoresist layer (not shown in FIG. 16, and subsequently removed) is formed on the third seed layer 25 (or on the second surface 102 of the substrate 10), where the fifth photoresist layer is formed in a pattern. Then, a second RDL 16 (including second segments 161 and connection pads 162) is formed on the third seed layer 25 (or on the second surface 102 of the substrate 10) according to the pattern of the fifth photoresist layer. In one or more embodiments, a material of the second RDL 16 (including the second segments 161 and the connection pads 162) is Cu, and a thickness of the second RDL 16 is about 10 µm. Then, the fifth photoresist layer is removed, and portions of the third seed layer 25 not covered by the second RDL 16 are removed, such as by wet etching. In one or more embodiments in which a material of the substrate 10 is semiconductor material, a barrier layer (not shown) is disposed between the second RDL 16 and the substrate 10. By the techniques illustrated and described, one second segment 161 electrically connects two second ends 182 of corresponding conductive vias 18. Therefore, by the first segments 143, the second conductive interconnectors 142 and the contact pads 151, the conductive vias 18 are electrically connected in series so as to from an inductor 3.

Figure 17:
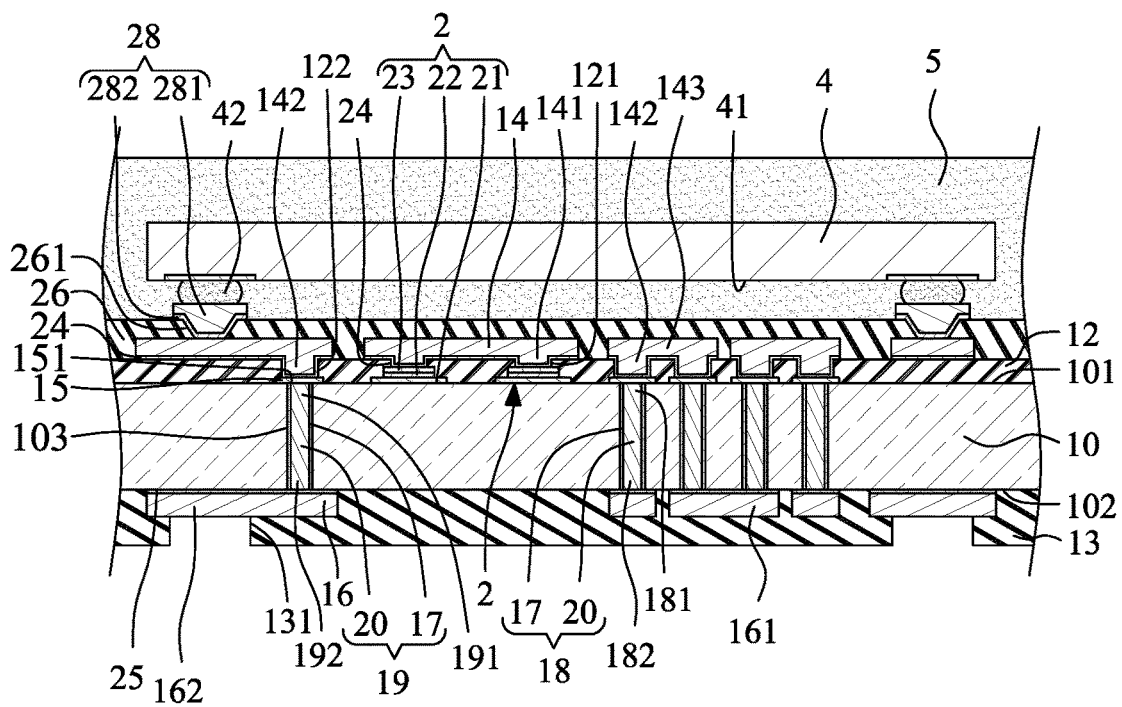

Referring to FIG. 17, a second insulation layer 13 is formed to cover the second RDL 16 and the second surface 102 of the substrate 10. The second insulation layer 13 defines openings 131 to expose the connection pads 162. In one or more embodiments, the second insulation layer 13 includes a polymer such as BCB, PI, PP or epoxy. In other embodiments, a material of the second insulation layer 13 may be, for example, silicon oxide or silicon nitride. In one or more embodiments, a thickness of the second insulation layer 13 may be about 9.5 µm.

Figure 18:
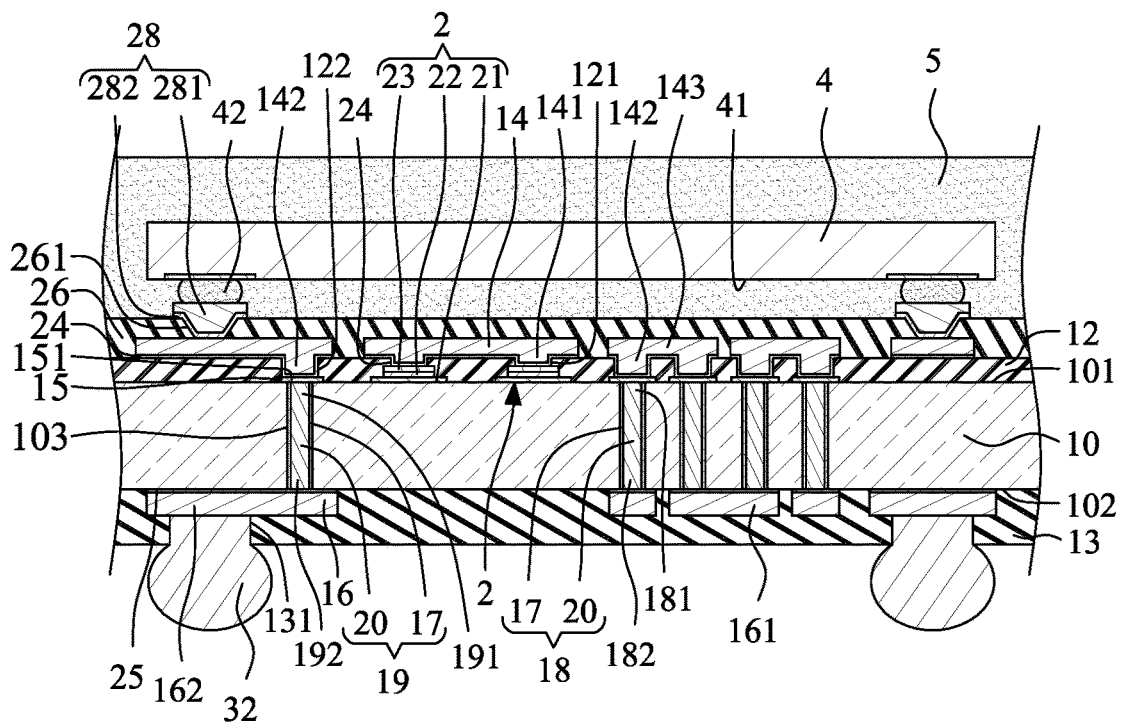

Referring to FIG. 18, external connection elements 32 (e.g., bumps or solder balls) are formed in the openings 131 of the second insulation layer 13 to contact the connection pads 162 for external connection. Then, singulation is performed to obtain the semiconductor device 1 as shown in FIG. 1.

Figure 19:
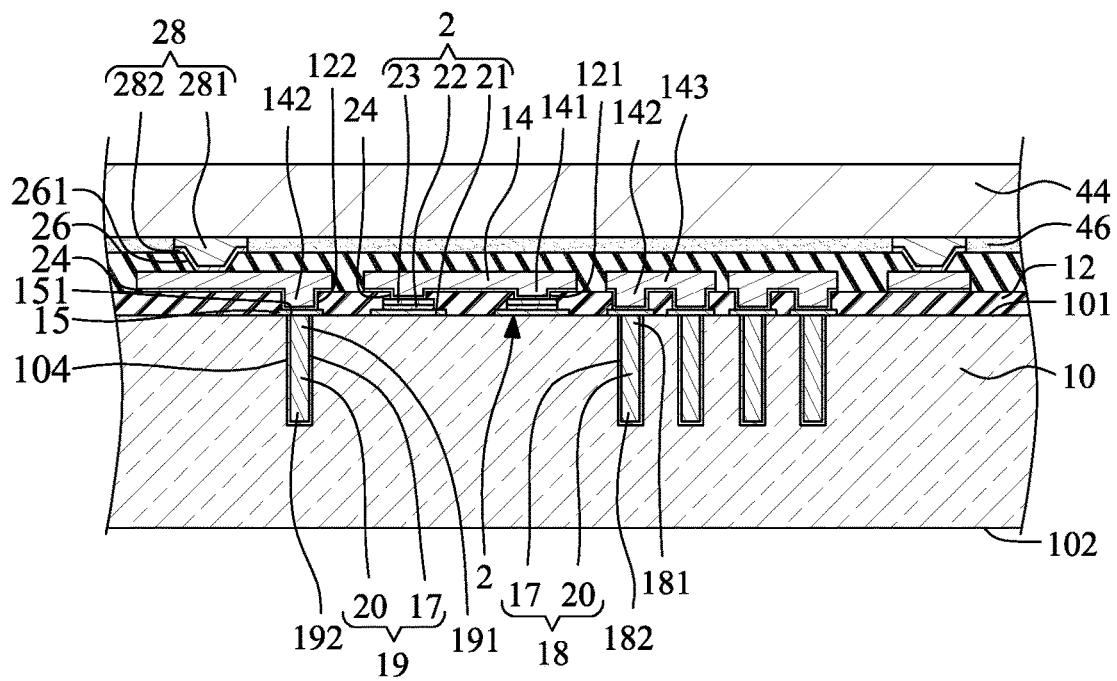
FIG. 19, FIG. 20, FIG. 21, FIG. 22, FIG. 23, FIG. 24, FIG. 25, FIG. 26 and FIG. 27 illustrate a method for manufacturing a semiconductor device according to an embodiment of the present disclosure.

FIGS. 19 to 27 illustrate a method for manufacturing a semiconductor device according to an embodiment of the present disclosure. The initial stages of this embodiment are the same as shown in FIGS. 6 to 12, and the stage of FIG. 19 is subsequent to the stage of FIG. 12. As shown in FIG. 19, a first carrier 44 is attached adjacent to the first RDL 14. In one or more embodiments, the first carrier 44 is attached to the protection layer 26 by an adhesion layer 46. The first carrier 44 may be, for example, a glass wafer, a silicon wafer or a silica wafer.

Figure 20:
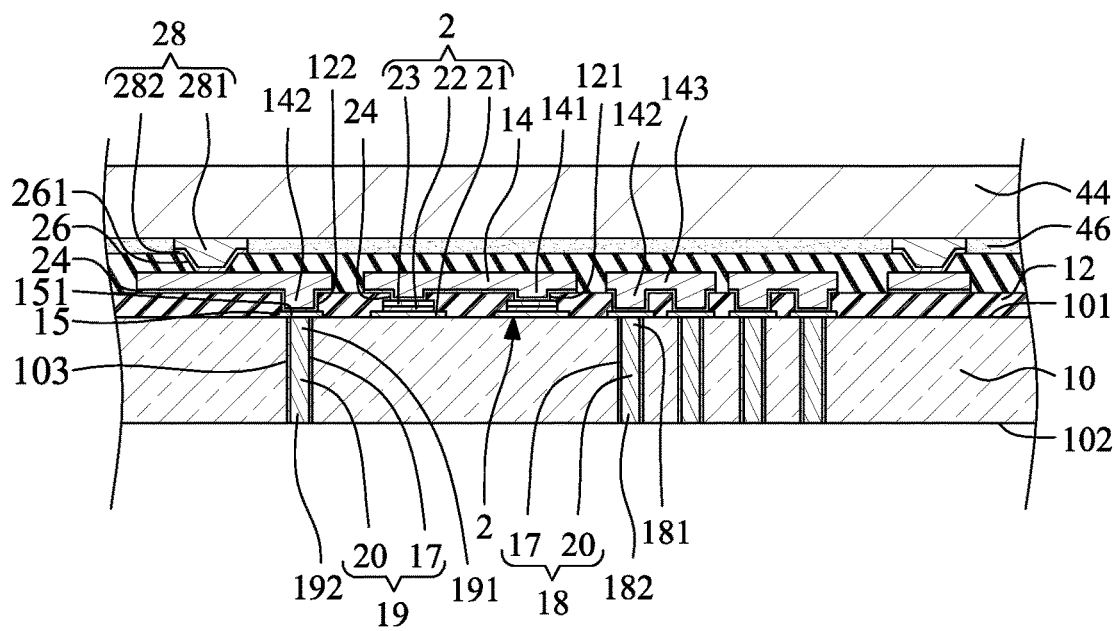

Referring to FIG. 20, the substrate 10 is thinned from the second surface 102 thereof, such as by backside grinding, to expose the conductive vias 18, 19. For example, a bottom portion of the substrate 10 with a thickness of about 450 µm is removed.

Figure 21:
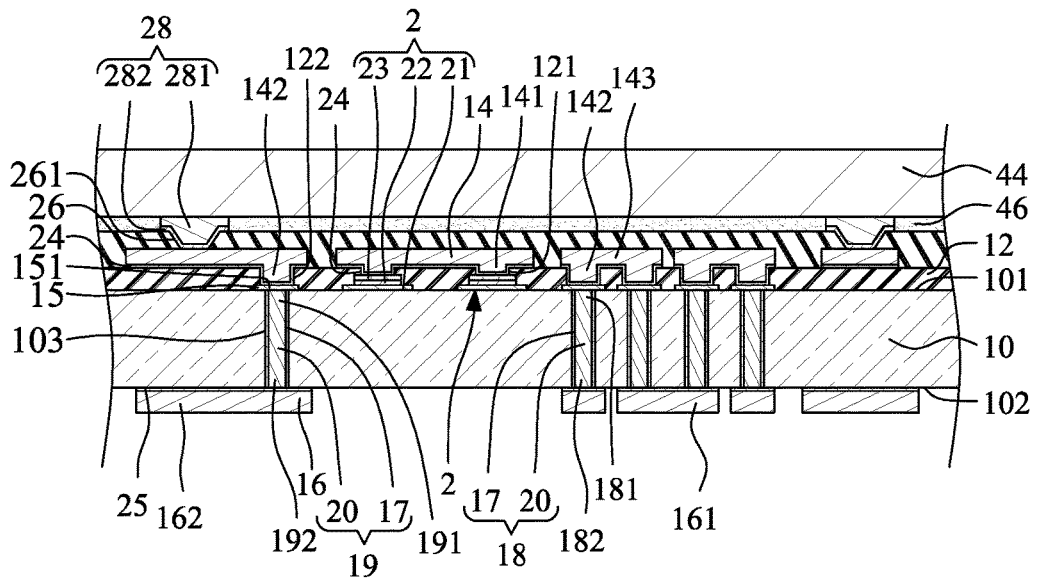

Referring to FIG. 21, a second RDL 16 is formed on the second surface 102 of the substrate 10 to electrically connect to the first RDL 14 through the conductive vias 18, 19. The formation of the second RDL 16 is similar to the stage of FIG. 16 described above.

Figure 22:
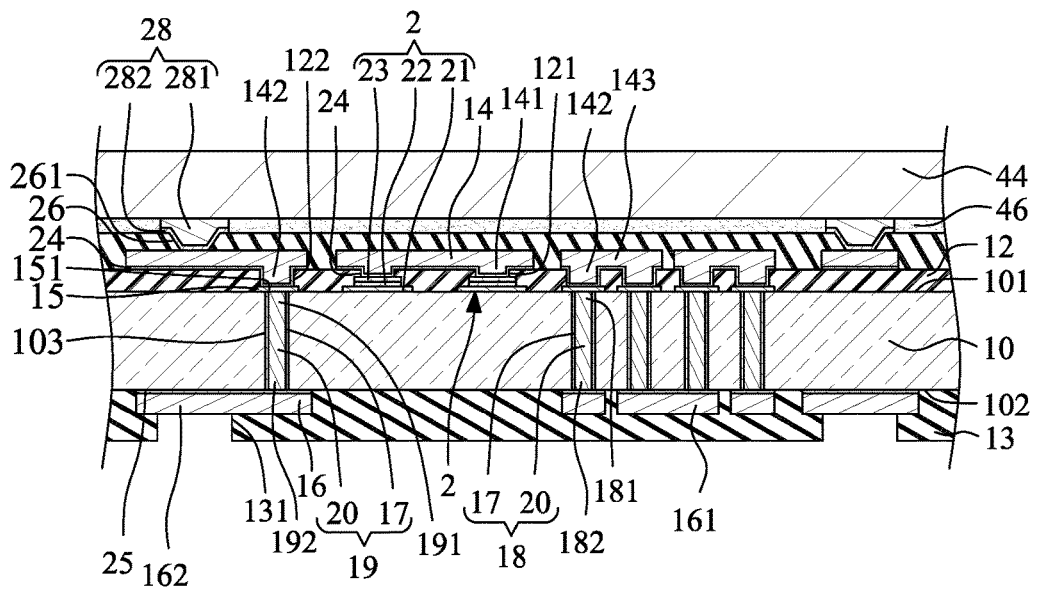

Referring to FIG. 22, a second insulation layer 13 is formed to cover the second RDL 16 and the second surface 102 of the substrate 10. The second insulation layer 13 defines openings 131 to expose the connection pads 162.

Figure 23:
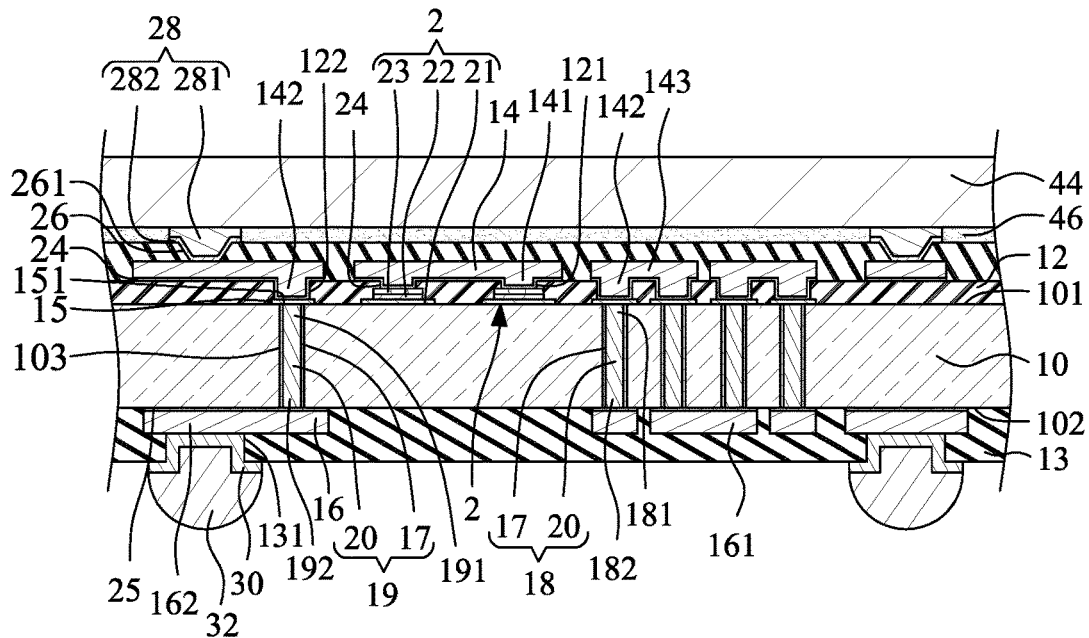

Referring to FIG. 23, second UBMs 30 are formed in the openings 131 of the second insulation layer 13 to contact the connection pads 162. Then, external connection elements 32 (e.g., bumps or solder balls) are formed on the second UBMs 30 for external connection.

Figure 24:
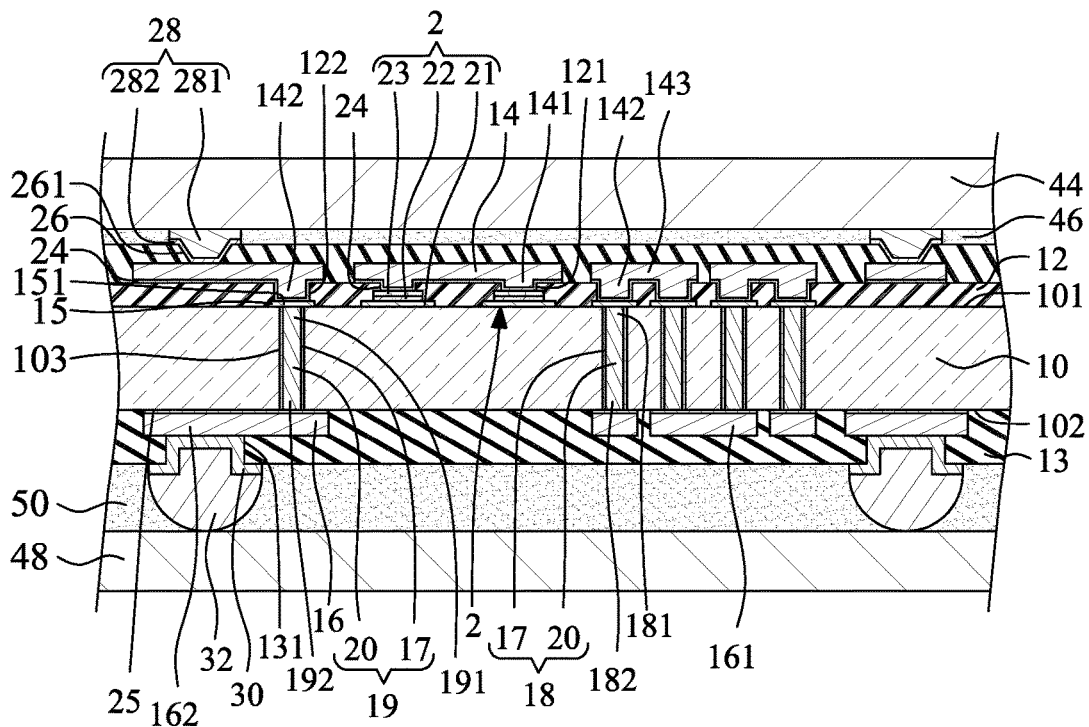

Referring to FIG. 24, a second carrier 48 is attached adjacent to the second insulation layer 13. In one or more embodiments, the second carrier 48 is attached to the second insulation layer 13 by an adhesion layer 50. The second carrier 48 may be, for example, a glass wafer, a silicon wafer or a silica wafer.

Figure 25:
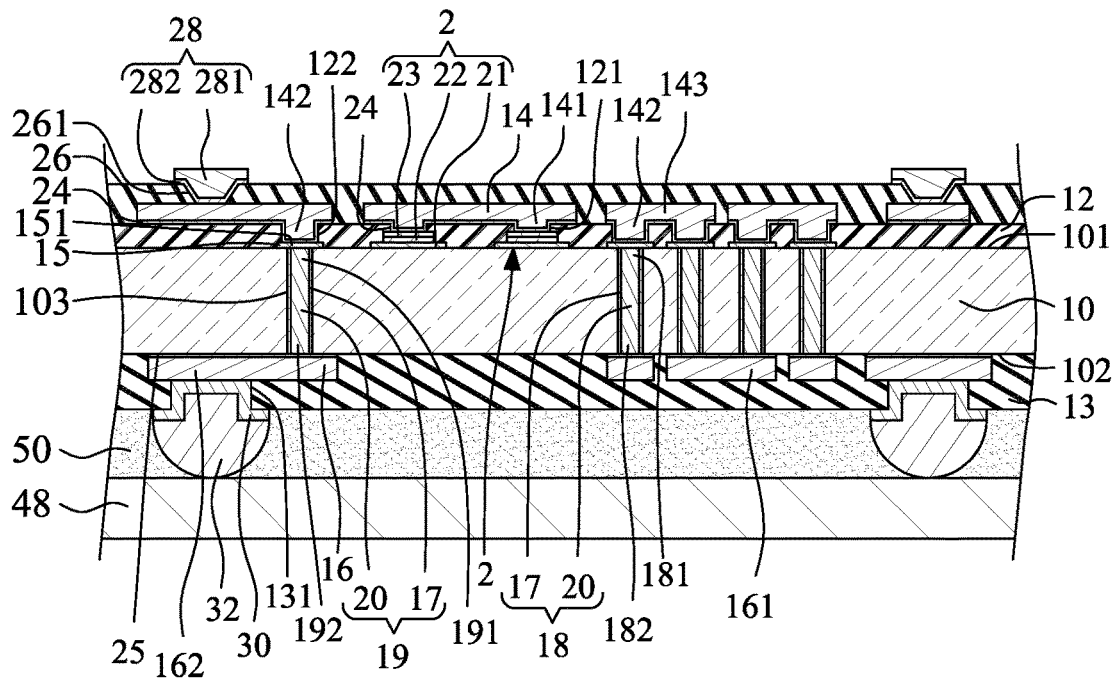

Referring to FIG. 25, the first carrier 44 and the adhesion layer 46 are detached from the protection layer 26.

Figure 26:
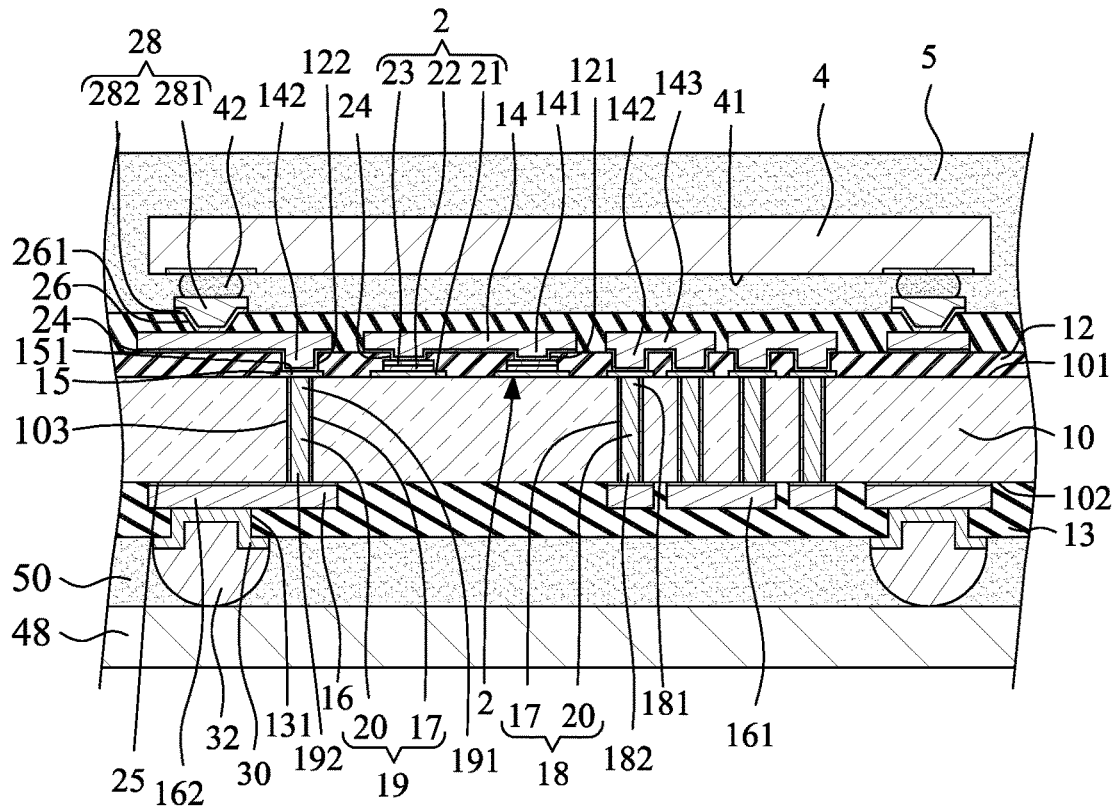

Referring to FIG. 26, a semiconductor chip 4 is disposed adjacent to, and is electrically connected to, the first RDL 14. As shown in FIG. 26, the semiconductor chip 4 includes connection elements 42 (e.g., bumps or solder balls) adjacent to the active surface 41 thereof. The connection elements 42 connect to the first UBMs 28. That is, the semiconductor chip 4 is electrically connected to the first RDL 14 by flip-chip bonding. Then, an encapsulant 5 is applied to cover the semiconductor chip 4 and the protection layer 26.

Figure 27:
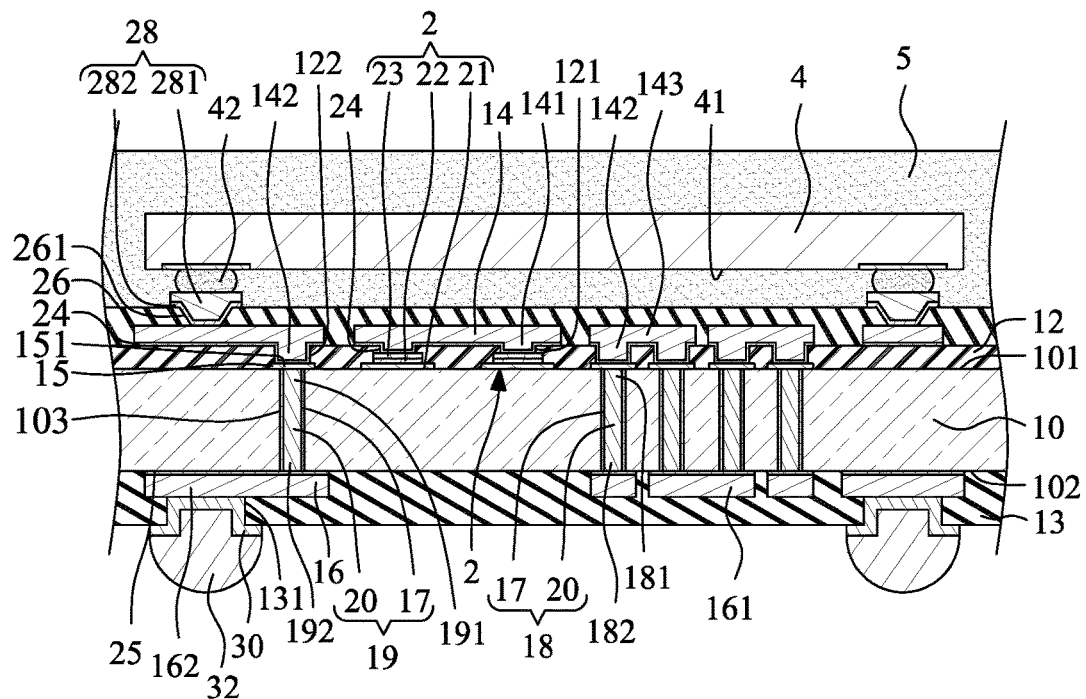

Referring to FIG. 27, the second carrier 48 and the adhesion layer 50 are detached from the second insulation layer 13. Then, singulation is performed to obtain the semiconductor device 1d as shown in FIG. 5.

Figure 28:
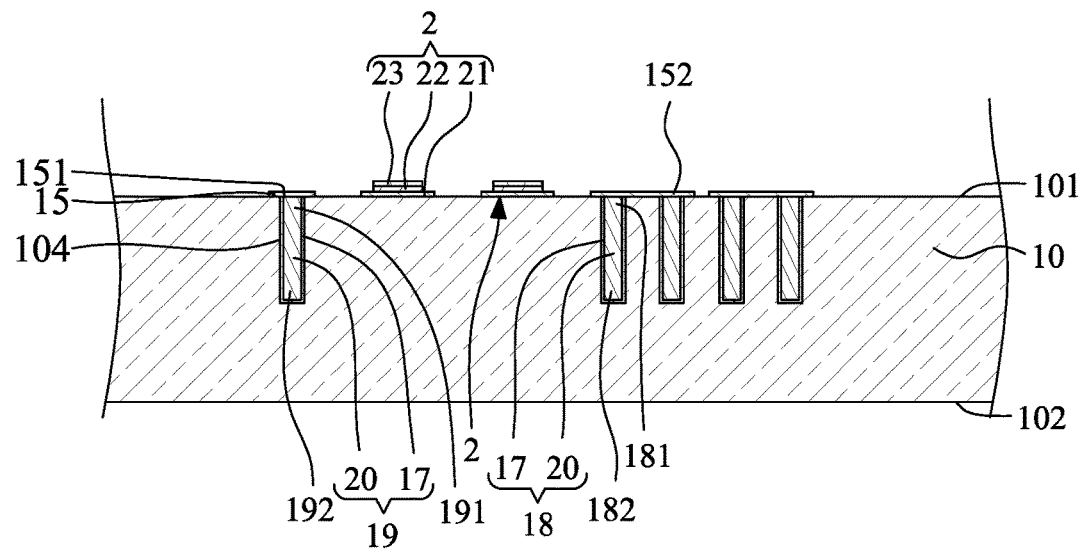
FIG. 28 illustrates a method for manufacturing a semiconductor device according to an embodiment of the present disclosure.

FIG. 28 illustrates a method for manufacturing a semiconductor device according to an embodiment of the present disclosure. The initial stages of this embodiment are the same as shown in FIGS. 6 to 7, and the stage of FIG. 28 is subsequent to the stage of FIG. 7. As shown in FIG. 28, after the first metal layer is patterned to become the patterned circuit layer 15, the patterned circuit layer 15 includes the lower electrodes 21 and the contact pads 151 and also the third segments 152. Two first ends 181 of corresponding conductive vias 18 are electrically connected in series by the third segment 152. The following stages of this embodiment are the same as shown in FIGS. 9 to 18, to obtain the semiconductor device 1b as shown in FIG. 3.

Figure 29:
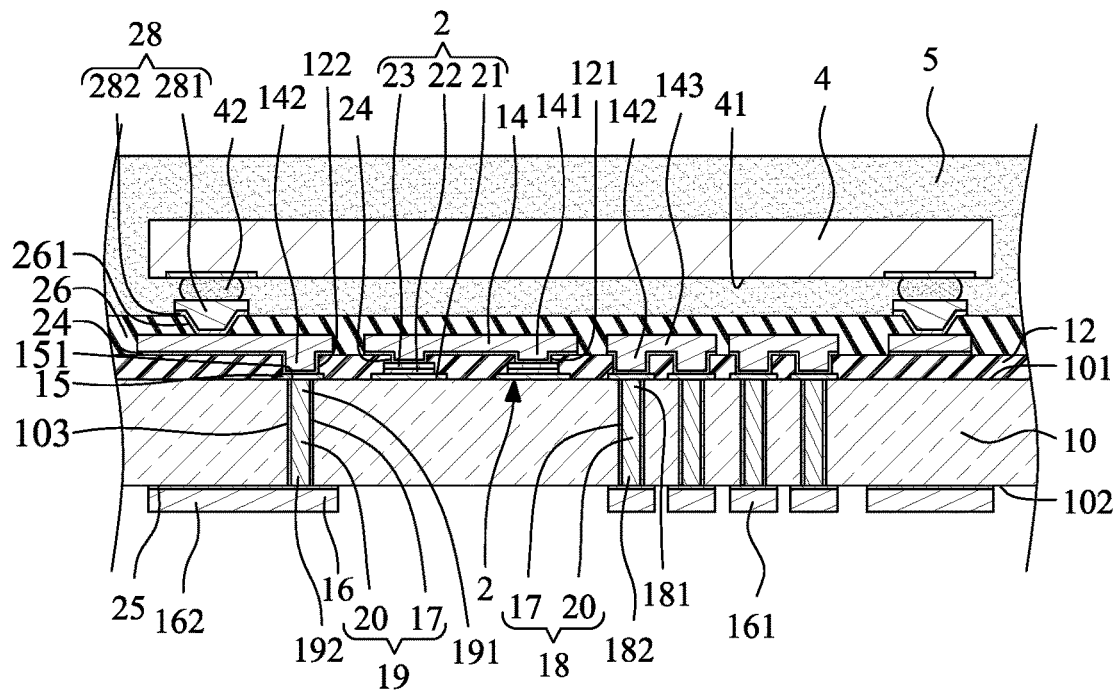
FIG. 29 and FIG. 30 illustrate a method for manufacturing a semiconductor device according to an embodiment of the present disclosure.
Figure 30:
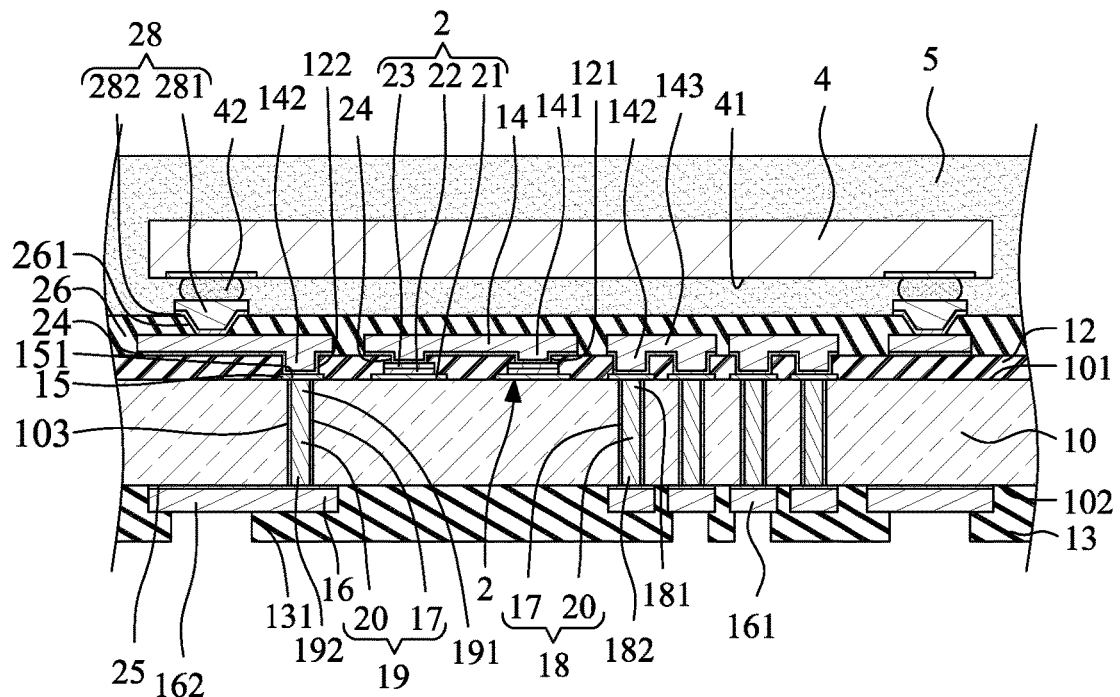

FIGS. 29 to 30 illustrate a method for manufacturing a semiconductor device according to an embodiment of the present disclosure. The initial stages of this embodiment are the same as shown in FIGS. 6 to 15, and the stage of FIG. 29 is subsequent to the stage of FIG. 15. As shown in FIG. 29, an optional third seed layer 25 is formed on the second surface 102 of the substrate 10, and a second RDL 16 (including second segments 161 and connection pads 162) is formed on the third seed layer 25 or on the second surface 102 of the substrate 10. The second segments 161 are pads that do not electrically connect to each other, and one second segment 161 does not electrically connect two second ends 182 of the corresponding conductive vias 18.

Referring to FIG. 30, a second insulation layer 13 is formed to cover the second RDL 16 and the second surface 102 of the substrate 10. The second insulation layer 13 defines openings 131 to expose the connection pads 162, and second openings 132 to expose ones of the second segments 161. A fourth RDL 36 may be formed on the second insulation layer 13 (not shown), and the following stage of this embodiment is the same as shown in FIG. 18, to obtain the semiconductor device 1c as shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a substrate having a first surface and a second surface;

at least one integrated passive device including at least one capacitor disposed adjacent to the first surface of the substrate, wherein the capacitor includes a lower electrode disposed on the first surface of the substrate;
a first redistribution layer disposed adjacent to the first surface of the substrate;
a second redistribution layer disposed adjacent to the second surface of the substrate; and
a plurality of conductive vias extending through the substrate, and electrically connecting the first redistribution layer and the second redistribution layer.

2. The semiconductor device according to claim 1, wherein the substrate comprises glass, silicon or silica.

3. The semiconductor device according to claim 1, wherein the capacitor includes a dielectric layer and an upper electrode, the dielectric layer is disposed on the lower electrode, and the upper electrode is disposed on the dielectric layer.

4. The semiconductor device according to claim 1, further comprising:
an insulation layer covering the capacitor and the first surface of the substrate, the insulation layer defining at least one first opening to expose a portion of the capacitor, the insulation layer further defining a plurality of second openings corresponding to the conductive vias;
a first conductive interconnector disposed in the first opening of the insulation layer and electrically connected to the capacitor; and
a plurality of second conductive interconnectors disposed in respective ones of the second openings of the insulation layer and electrically connected to the conductive vias.

5. The semiconductor device according to claim 4, wherein the first redistribution layer is disposed on the insulation layer, and the first conductive interconnector and the second conductive interconnectors are portions of the first redistribution layer.

6. The semiconductor device according to claim 1, wherein the integrated passive device further includes an inductor including at least two conductive vias that are electrically connected in series.

7. The semiconductor device according to claim 1, wherein the substrate defines a plurality of through holes, each of the conductive vias comprises a conductor material and an inner insulation layer, the conductor material is disposed on a side wall of a respective through hole to define a central groove, and the central groove is filled with the inner insulation layer.

8. The semiconductor device according to claim 1, further comprising a semiconductor chip and an encapsulant, wherein the semiconductor chip is disposed adjacent to, and is electrically connected to, the first redistribution layer, and the encapsulant covers the semiconductor chip.

9. The semiconductor device according to claim 1, wherein each of the conductive vias has a first end adjacent to the first surface of the substrate.

10. The semiconductor device according to claim 1, wherein the conductive vias form at least a portion of an integrated three-dimensional inductor.

11. A semiconductor device, comprising:
a substrate having a first surface and a second surface;
integrated passive devices comprising an inductor, and further comprising at least one capacitor disposed adjacent to the first surface of the substrate, wherein the capacitor includes a lower electrode disposed on the first surface of the substrate;
a first segment disposed adjacent to the first surface of the substrate;
a second segment disposed adjacent to the second surface of the substrate; and
a plurality of conductive vias extending through the substrate, wherein each of the conductive vias has a first end adjacent to the first surface of the substrate and a second end adjacent to the second surface of the substrate, wherein the first segment electrically connects first ends of a first one and a second one of the conductive vias, and the second segment electrically connects second ends of the second one and a third one of the conductive vias, and wherein the inductor comprises a series electrical connection of the first one, the second one and the third one of the conductive vias.

12. The semiconductor device according to claim 11, wherein the capacitor includes a dielectric layer disposed on the lower electrode, and an upper electrode disposed on the dielectric layer.

13. The semiconductor device according to claim 11, further comprising:
an insulation layer covering the capacitor and the first surface of the substrate, the insulation layer defining at least one first opening to expose a portion of the capacitor, the insulation layer further defining a plurality of second openings corresponding to the conductive vias;
a first conductive interconnector disposed in the first opening of the insulation layer to electrically connect to the capacitor; and
a plurality of second conductive interconnectors disposed in respective second openings of the insulation layer to electrically connect to the conductive vias.

14. The semiconductor device according to claim 11, wherein the substrate defines a plurality of through holes, each of the conductive vias comprises a conductor material and an inner insulation layer, the conductor material is disposed on a side wall of a respective through hole to define a central groove, and the central groove is filled with the insulation layer.

15. The semiconductor device according to claim 11, further comprising a semiconductor chip and an encapsulant, wherein the semiconductor chip is disposed adjacent to the first surface of the substrate, and the encapsulant covers the semiconductor chip.

16. A semiconductor device, comprising:
a substrate having a first surface and a second surface;
integrated passive devices including an inductor and a capacitor disposed adjacent to the first surface of the substrate;
a first redistribution layer disposed adjacent to the first surface of the substrate, the first redistribution layer including a first segment;
a second redistribution layer disposed adjacent to the second surface of the substrate, the second redistribution layer including a second segment; and
a plurality of conductive vias extending through the substrate, and electrically connecting the first segment and the second segment,
wherein the first segment, the second segment and the conductive vias are configured as the inductor.

17. The semiconductor device according to claim 16, wherein each of the conductive vias has a first end adjacent to the first surface of the substrate and a second end adjacent to the second surface of the substrate, the first segment electrically connects first ends of a first one and a second one of the conductive vias, and the second segment electrically connects second ends of the second one and a third one of the conductive vias.

18. The semiconductor device according to claim 17, wherein the first segment is misaligned with the second segment.

19. The semiconductor device according to claim 16, wherein the capacitor includes a lower electrode, a dielectric layer and an upper electrode, the lower electrode is disposed on the first surface of the substrate, the dielectric layer is disposed on the lower electrode, and the upper electrode is disposed on the dielectric layer.

20. The semiconductor device according to claim 19, further comprising:
   a patterned circuit layer disposed on the first surface of the substrate, wherein a first portion of the patterned circuit layer is configured as the lower electrode of the capacitor and a second portion of the patterned circuit layer is electrically connected with the first redistribution layer.

21. The semiconductor device according to claim 16, wherein the substrate defines a plurality of through holes, each of the conductive vias comprises a conductor material and an inner insulation layer, the conductor material is disposed on a side wall of a respective through hole to define a central groove, and the central groove is filled with the inner insulation layer.

22. The semiconductor device according to claim 16, further comprising a semiconductor chip and an encapsulant, wherein the semiconductor chip is disposed adjacent to, and is electrically connected to, the first redistribution layer, and the encapsulant covers the semiconductor chip.

* * * * *